(12) United States Patent
Shimizu et al.

(10) Patent No.: US 10,770,471 B2
(45) Date of Patent: Sep. 8, 2020

(54) SEMICONDUCTOR DEVICE

(71) Applicant: Toshiba Memory Corporation, Minato-ku (JP)

(72) Inventors: Kojiro Shimizu, Yokkaichi (JP); Hanae Ishihara, Yokkaichi (JP); Yumiko Miyano, Shinagawa (JP)

(73) Assignee: Toshiba Memory Corporation, Minato-ku (JP)

( * ) Notice: Subject to any disclaimer, the term of this patent is extended or adjusted under 35 U.S.C. 154(b) by 24 days.

(21) Appl. No.: 16/291,107

(22) Filed: Mar. 4, 2019

(65) Prior Publication Data

US 2020/0051989 A1 Feb. 13, 2020

(30) Foreign Application Priority Data

Aug. 10, 2018 (JP) ................................. 2018-151824

(51) Int. Cl.
*H01L 27/11556* (2017.01)
*H01L 27/11582* (2017.01)
*H01L 23/52* (2006.01)

(52) U.S. Cl.
CPC ........ *H01L 27/11556* (2013.01); *H01L 23/52* (2013.01); *H01L 27/11582* (2013.01)

(58) Field of Classification Search
None
See application file for complete search history.

(56) References Cited

U.S. PATENT DOCUMENTS

| 8,592,890 | B2 | 11/2013 | Watanabe et al. |
| 9,853,033 | B2 | 12/2017 | Cui |
| 10,504,901 | B2* | 12/2019 | Yoo ................ H01L 27/11524 |
| 2017/0084532 | A1 | 3/2017 | Son et al. |
| 2017/0256551 | A1* | 9/2017 | Lee ................ H01L 27/11582 |
| 2017/0358590 | A1 | 12/2017 | Kang et al. |
| 2018/0197874 | A1 | 7/2018 | Oshiki et al. |
| 2019/0326166 | A1* | 10/2019 | Nam ................ H01L 23/5226 |

FOREIGN PATENT DOCUMENTS

JP 2012-59966 3/2012

* cited by examiner

*Primary Examiner* — Mounir S Amer
(74) *Attorney, Agent, or Firm* — Oblon, McClelland, Maier & Neustadt, L.L.P.

(57) ABSTRACT

A semiconductor device according to an embodiment includes a first contact electrically connected to a first conductive layer with a diameter size smaller than a diameter size of a first support pillar at a region position on an inner side in a radial direction of the first support pillar in a first region and extending to the opposite side of the substrate with respect to the first conductive layer; and a second contact electrically connected to a second conductive layer with a diameter size smaller than a diameter size of a second support pillar at a position of penetrating through the first conductive layer at a region position on an inner side in a radial direction of the second support pillar in the first region and extending to the opposite side of the substrate with respect to the second conductive layer.

20 Claims, 34 Drawing Sheets

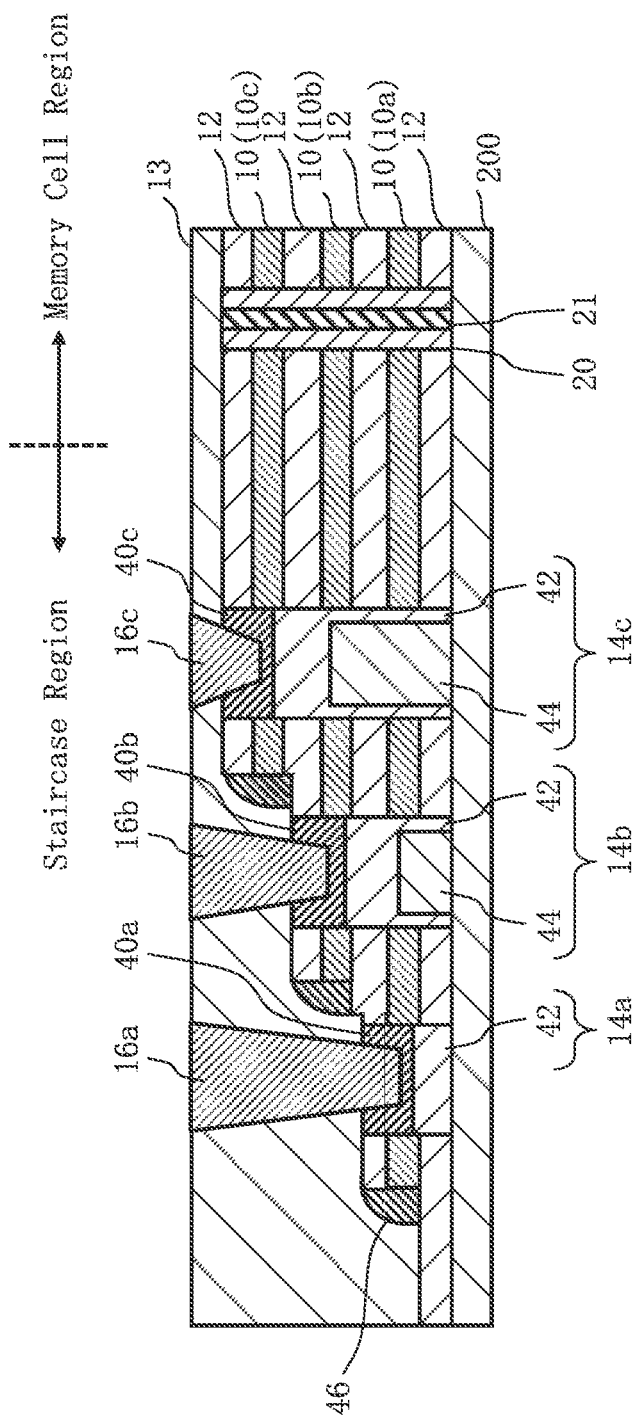
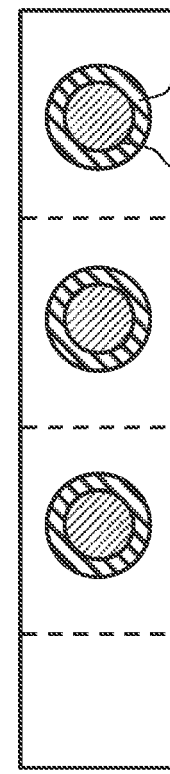
FIG. 18A
FIG. 18B

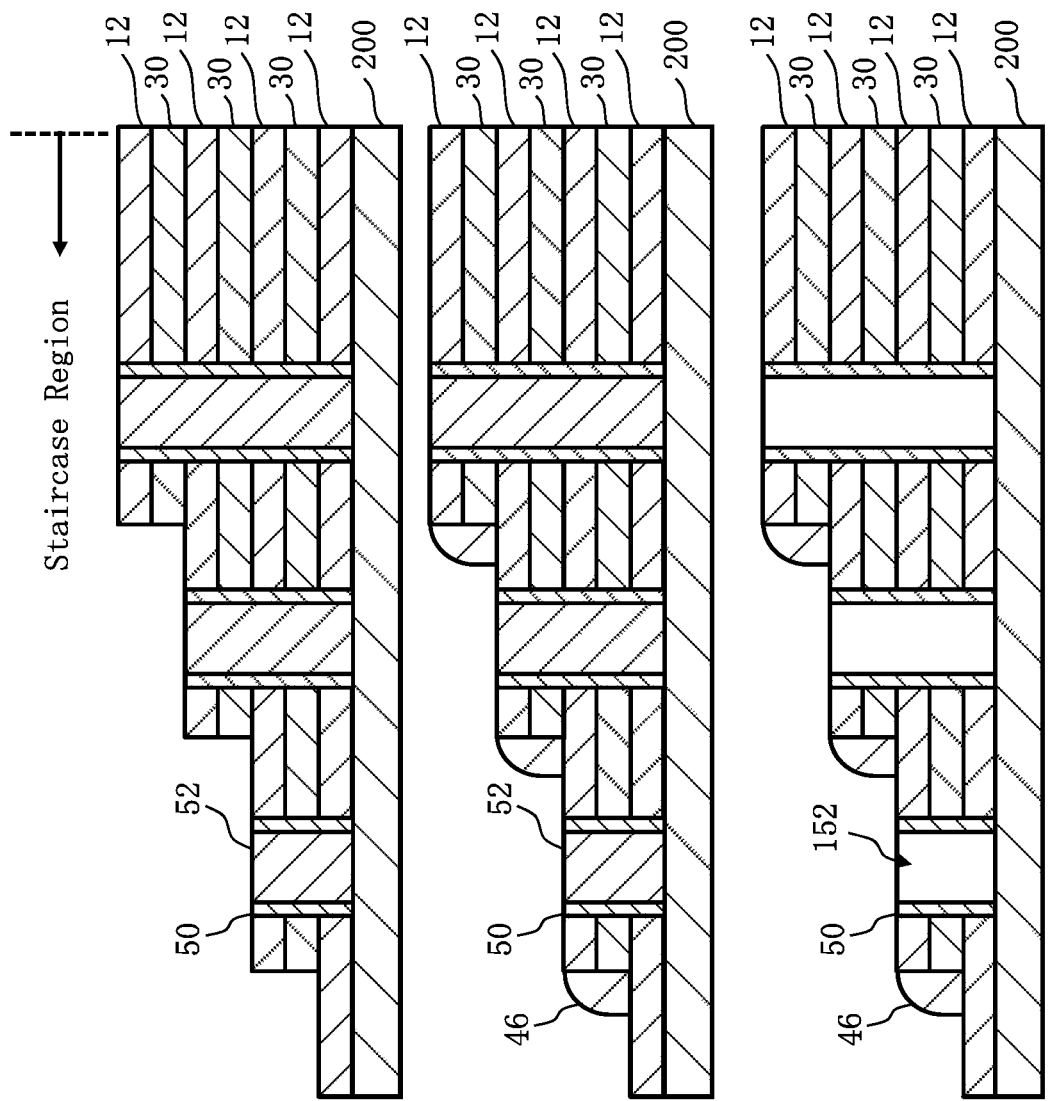

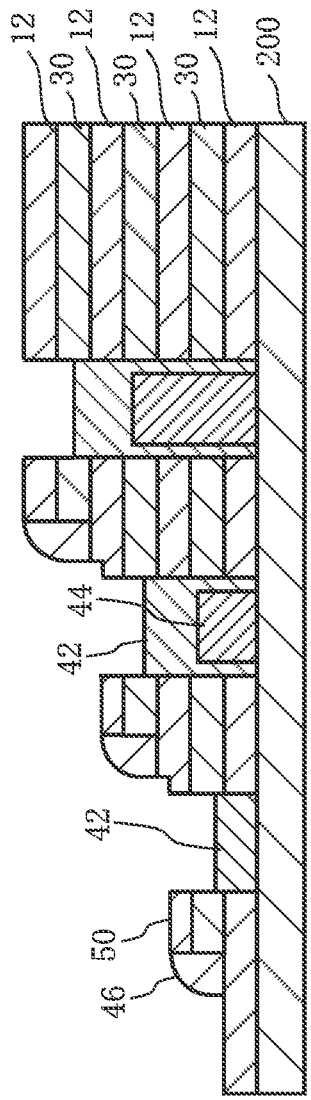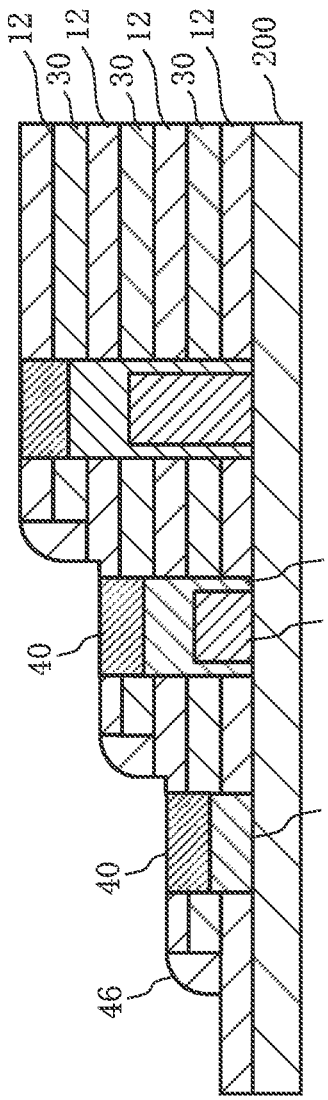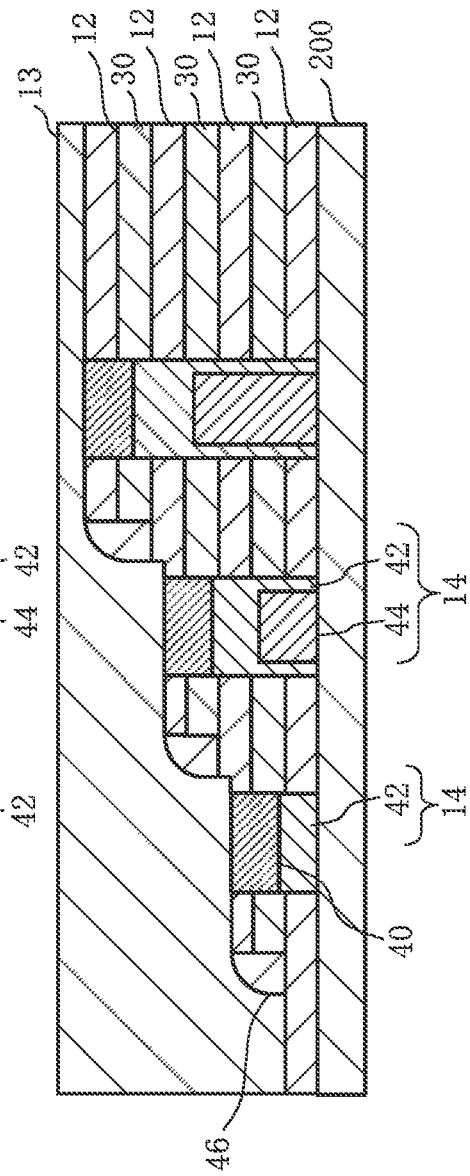
FIG. 25A
FIG. 25B
FIG. 25C

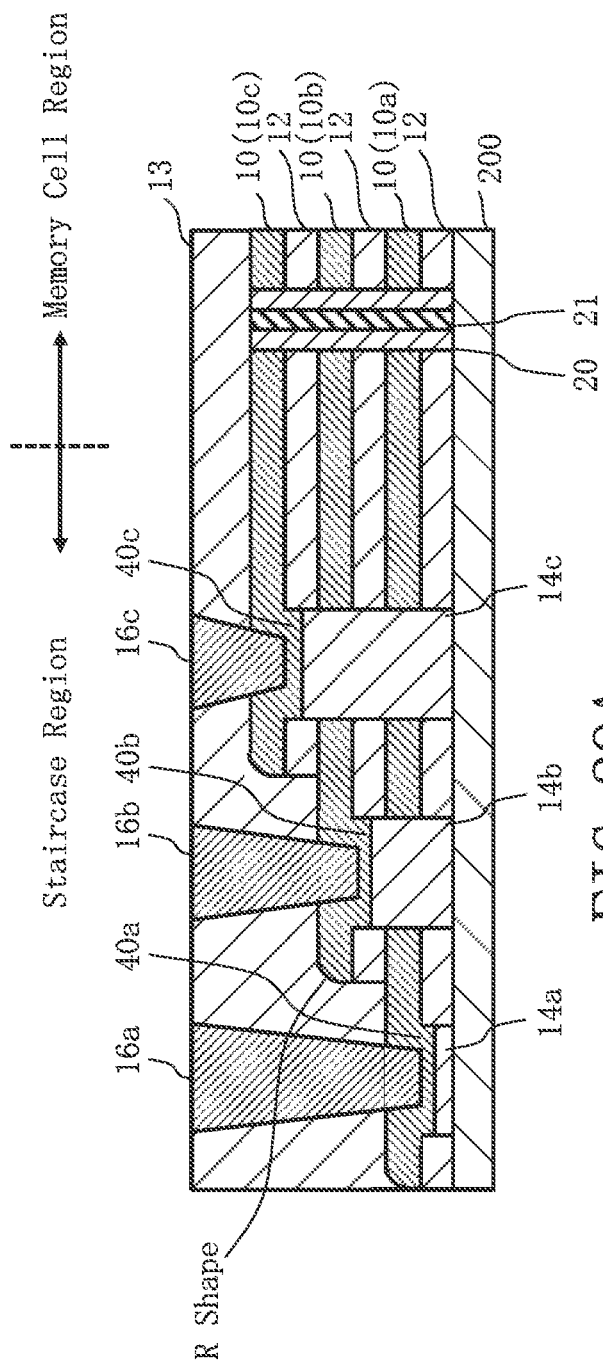
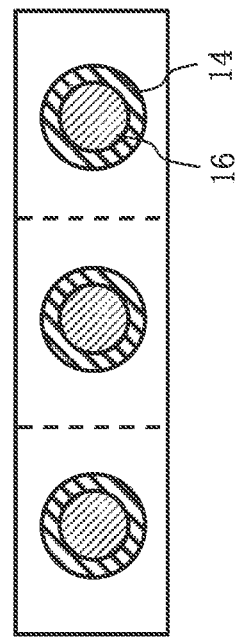
FIG. 29A
FIG. 29B

SEMICONDUCTOR DEVICE

CROSS-REFERENCE TO RELATED APPLICATION

This application is based upon and claims the benefit of priority from Japanese Patent Application No. 2018-151824 filed on Aug. 10, 2018 in Japan, the entire contents of which are incorporated herein by reference.

FIELD

Embodiments described herein relate generally to a semiconductor device.

BACKGROUND

In the development of semiconductor devices, particularly, semiconductor storage devices, miniaturization of memory cells has proceeded in order to achieve higher capacity, lower cost, and the like. For example, development of three-dimensional NAND type flash memory devices in which memory cells are three-dimensionally arranged have proceeded. In the three-dimensional NAND type flash memory device, a NAND string in which memory cells are connected in a direction (so-called vertical direction) perpendicular to the word line layer surface is formed in word line layers stacked with interposing dielectric layers. Therefore, higher integration is achieved as compared with a case where memory cells are two-dimensionally arranged. In the three-dimensional NAND flash memory device, as a structure for connecting a wire of another layer to the conductive layer to be a word line of each stacked layer, there is a structure in which the conductive layers are formed in a staircase shape so as to be shifted from layer to layer, and thus, it is easy to connect with a contact on the upper layer side. However, in some cases, a contact penetrates through a target conductive layer and reaches the conductive layer on the lower layer side, so that electrical connection may be formed between the contact and the conductive layer on the lower layer side.

BRIEF DESCRIPTION OF THE DRAWINGS

FIGS. 18A and 18B are views illustrating an example of the cross-sectional configuration of a semiconductor device and an example of an arrangement configuration of contacts and support pillars in a step region in Embodiment 2;

FIGS. 23A to 23C are cross-sectional views illustrating a portion of the processes of the method of manufacturing the semiconductor device according to Embodiment 2;

FIGS. 25A to 25C are cross-sectional views illustrating a portion of the processes of the method of manufacturing the semiconductor device according to Embodiment 2;

FIGS. 29A and 29B are views illustrating an example of the cross-sectional configuration of a semiconductor device and an example of an arrangement configuration of contacts and support pillars in a step region in Embodiment 3;

DETAILED DESCRIPTION

Hereinafter, embodiments of semiconductor devices capable of avoiding connection to a conductive layer of a lower layer side in contact connection will be described.

A semiconductor device according to an embodiment includes a substrate, a first conductive layer, a second conductive layer, a first support pillar, a second support pillar, a first contact, a second contact, a channel body, and a memory film. The first conductive layer is formed in a plate shape, provided above the substrate and extending in parallel with a surface of the substrate so as to spread over first and second regions. The second conductive layer is formed in a plate shape, arranged to be separated at a distance above the first conductive layer so as to have a staircase shape with an end portion of the first conductive layer protruding, the second conductive layer extending in parallel with the first conductive layer so as to spread over the first and second regions. The first support pillar is connected to a lower surface or a side surface of the first conductive layer and extending toward the substrate at a position in the first region and not overlapping with the second conductive layer. The second support pillar is connected to a lower surface or a side surface of the second conductive layer and extending toward the substrate so as to penetrate through the first conductive layer in the first region. The first contact is electrically connected to the first conductive layer with a diameter size smaller than a diameter size of the first support pillar at a region position on an inner side in a radial direction of the first support pillar in the first region and extending to the opposite side of the substrate with respect to the first conductive layer. The second contact is electrically connected to the second conductive layer with a diameter size smaller than a diameter size of the second support pillar at a position of penetrating through the first conductive layer at a region position on an inner side in a radial direction of the second support pillar in the first region and extending to the opposite side of the substrate with respect to the second conductive layer. The channel body uses a semiconductor material and penetrates through the first and second conductive layers in the second region. The memory film includes a charge accumulation film and is provided between each of the first and second conductive layers and the channel body in the second region.

Hereinafter, in the embodiments, a three-dimensional NAND flash memory device will be described as an example of the semiconductor device. Hereinafter, the embodiments will be described with reference to the drawings.

Embodiment 1

Figure 1:
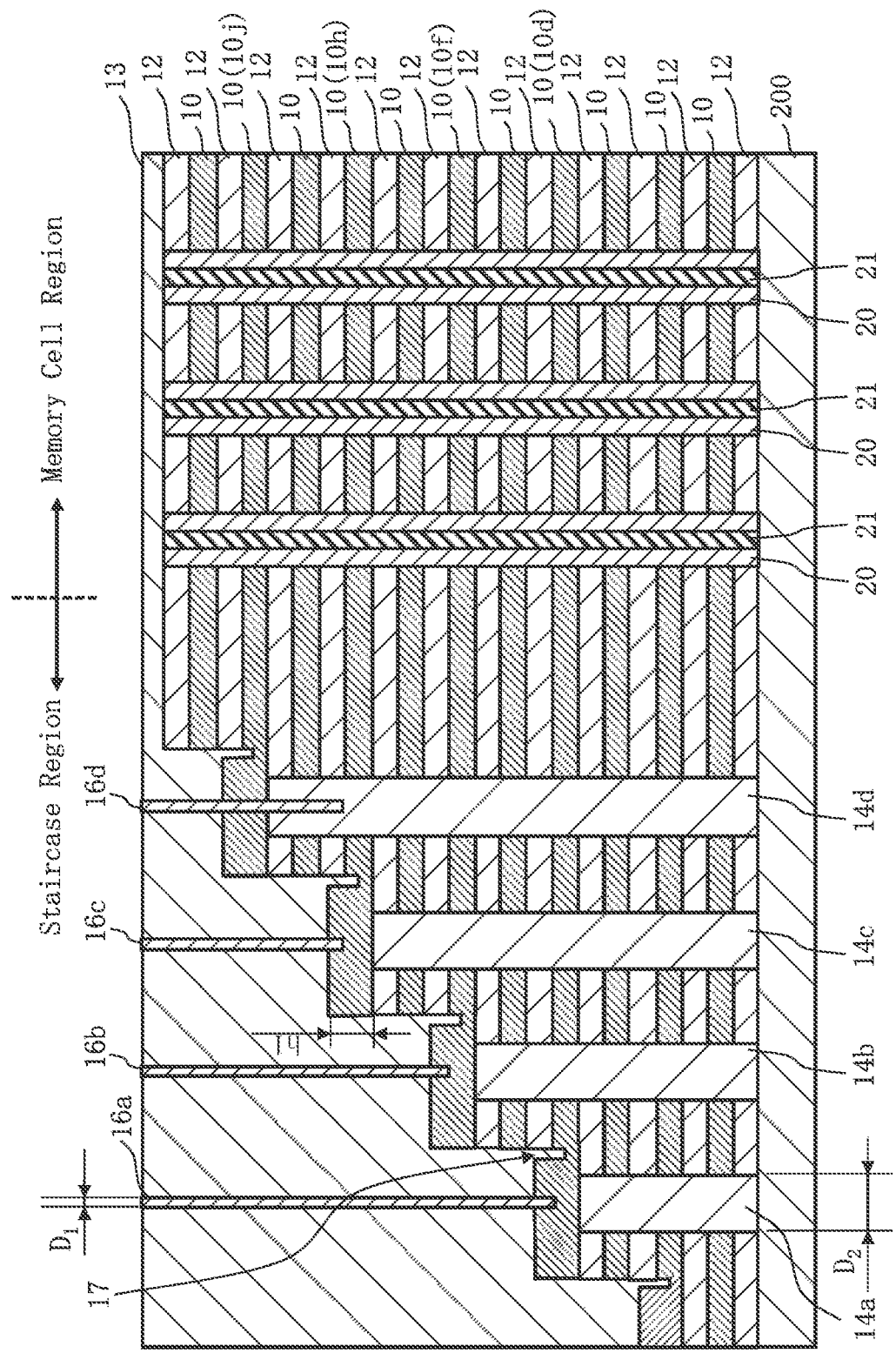
FIG. 1 is a cross-sectional view illustrating an example of the configuration of a semiconductor device according to Embodiment 1.

FIG. 1 is a cross-sectional view illustrating an example of the configuration of a semiconductor device according to Embodiment 1. In FIG. 1, in the semiconductor device according to Embodiment 1, a conductive layer 10 of each layer among the conductive layers 10 of a plurality of layers serving as word lines (WL) in a semiconductor storage device and a dielectric layer 12 of each layer among the dielectric layers 12 of a plurality of layers insulating the conductive layers 10 of adjacent layers are alternately stacked above a semiconductor substrate 200 (substrate). The conductive layer 10 of each layer is formed in a plate shape, and extending in parallel with the surface of the semiconductor substrate 200 so as to spread over a staircase region (word line contact region) (first region) and a memory cell region (second region). In the example of FIG. 1, the dielectric layer 12 is first arranged above the semiconductor substrate 200, and the dielectric layer 12 is also arranged on the conductive layer 10 of the uppermost layer. In FIG. 1, a stacked body of the conductive layers 10 of the plurality of layers and the dielectric layers 12 of the plurality of layers is formed in a staircase region so as to have a staircase shape in which the lower layer side protrudes. In the example of FIG. 1, the staircase shape is formed by terraces, and the each terrace is configured with, for example, two set layers. The set of one conductive layer 10 and one dielectric layer 12 constitutes each set layer of the two set layers constituting each terrace. In addition, the number of layers of the set layers constituting each terrace of the terraces is not limited to two set layers each. The number of layers of the set layers may be three or more. Alternatively, the number of layers of the set may be one. Although not illustrated in FIG. 1, when each terrace of the terraces is configured with two or more set layers, the set of the conductive layer 10 and the dielectric layer 12 is formed so as to have a staircase shape in which the lower layer side protrudes by one set layer on the back side toward the paper surface of FIG. 1. In the example of FIG. 1, for example, the conductive layer 10d (an example of the first conductive layer) of the fourth layer is formed in a plate shape, provided to be separated above the semiconductor substrate 200 and extends in parallel with the surface of the semiconductor substrate 200 so as to spread over the staircase region and the memory cell region. Then, the conductive layer 10f (an example of the second conductive layer) of the sixth layer is formed in a plate shape, arranged to be separated at a distance above the conductive layer 10d so as to have a staircase shape in which the end portion of the conductive layer 10d protrudes, and extends in parallel with the conductive layer 10d so as to spread over the staircase region and the memory cell region. The terraces in the staircase region are covered with a dielectric film 13.

Figure 2:
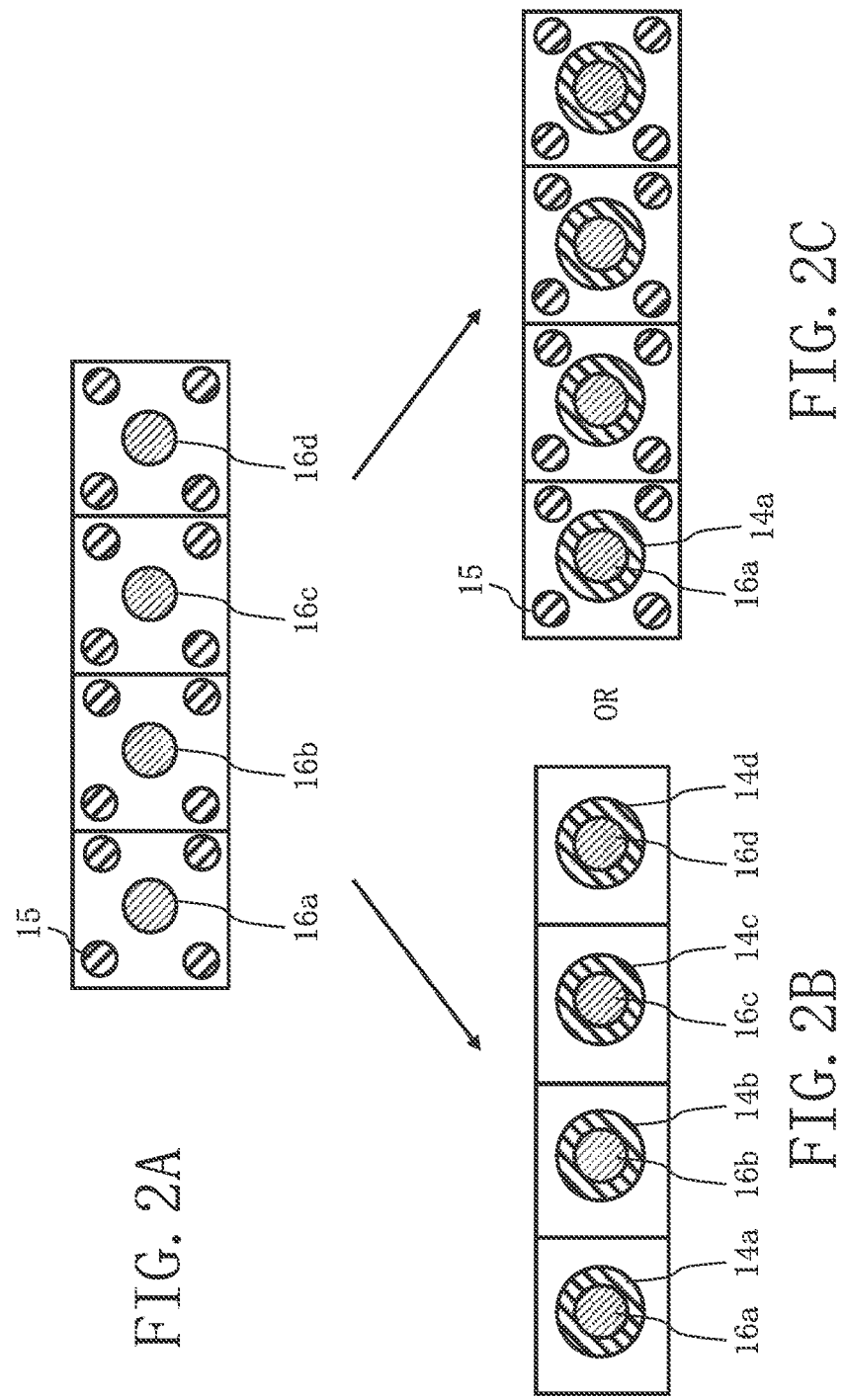
FIGS. 2A to 2C are top views for describing examples of arrangement configuration of contacts and support pillars in a step region in Embodiment 1 and Comparative Example.

FIGS. 2A to 2C are top views for describing an example of arrangement configuration of contacts and support pillars in the staircase region in Embodiment 1 and Comparative Example. As described above, by configuring the stacked body of the conductive layer 10 and the dielectric layer 12 in a staircase shape, each conductive layer 10 is formed as a structure of being easily connected to the contact 16 from the upper layer side. Herein, in Comparative Example of Embodiment 1 illustrated in FIG. 2A, the contact 16 is connected to the corresponding conductive layer from the upper side, for example, at the center of each terrace having a staircase shape. On the other hand, on the lower layer side of each terrace having a staircase shape, a total of four support pillars 15 are arranged one by one at, for example, positions of four corners of the terrace away from the contact 16. In such a configuration, there is a possibility that the contact 16 penetrates through the conductive layer 10 to be connected and reaches the conductive layer 10 of the lower layer side, and electrical connection is made with respect to the conductive layer 10 of the lower layer side. Furthermore, in the example of FIG. 2A, a terrace area is required for being capable of arranging all of the four support pillars 15 and the contacts 16 at different positions with respect to the terrace of one word line (conductive layer 10). In order to further increase the integration of the three-dimensional NAND flash memory device, it is preferable to reduce the area of the terrace. Therefore, in Embodiment 1, as illustrated in FIG. 2B, the support pillar 14 made of a dielectric material having a larger diameter size than the contact 16 is used. In addition, in Embodiment 1, the support pillars 14 made of the dielectric material are arranged below the respective contacts 16. Hereinafter, this will be described in detail.

In FIG. 1, each of the uppermost surfaces of the terraces having a staircase shape in the staircase region is configured with a conductive layer 10. For example, the support pillar 14a (an example of the first support pillar) is connected to the lower surface or the side surface of the conductive layer 10d at a position in the staircase region and not overlapping with the conductive layer 10f, and extends toward the semiconductor substrate 200. The support pillar 14b (an example of the second support pillar) is connected to the lower surface or the side surface of the conductive layer 10f and extends toward the semiconductor substrate 200 so as to penetrate through the conductive layer 10d in the staircase region. The support pillar 14c is connected to the lower surface or side surface of the conductive layer 10h and extends toward the semiconductor substrate 200 so as to penetrate through the conductive layers 10d and 10f in the staircase region. The support pillar 14d is connected to the lower surface or the side surface of the conductive layer 10j and extends toward the semiconductor substrate 200 so as to penetrate through the conductive layers 10d, 10f, and 10h in the staircase region.

The contact 16a (an example of the first contact) is electrically connected to the conductive layer 10d with a diameter size D1 smaller than a diameter size D2 of the support pillar 14a at the region position on the inner side in the radial direction of the support pillar 14a in the staircase region. In addition, the contact 16a extends upward on the side opposite to the semiconductor substrate 200 with respect to the conductive layer 10d. Similarly, the contact 16b (an example of the second contact) is electrically connected to the conductive layer 10f with a diameter size smaller than the diameter size of the support pillar 14b at a position of penetrating through the conductive layer 10d at the region position on the inner side in the radial direction of the support pillar 14b in the staircase region. In addition, in the example of FIG. 1, the contact 16b is electrically connected to the conductive layer 10f with a diameter size smaller than the diameter size of the support pillar 14b at a position of being connected to the conductive layer 10f at the region position on the inner side in the radial direction of the support pillar 14b in the staircase region. The contact 16b extends upward on the side opposite to the semiconductor substrate 200 with respect to the conductive layer 10f. Similarly, the contact 16c is electrically connected to the conductive layer 10h with a diameter size smaller than the diameter size of the support pillar 14c at a position of penetrating through the conductive layers 10d and 10f at the region position on the inner side in the radial direction of the support pillar 14c in the staircase region. In addition, in the example of FIG. 1, the contact 16c is electrically connected to the conductive layer 10h with a diameter size smaller than the diameter size of the support pillar 14c at a position of being connected to the conductive layer 10h at the region position on the inner side in the radial direction of the support pillar 14c in the staircase region. The contact 16c extends upward on the side opposite to the semiconductor substrate 200 with respect to the conductive layer 10h. Similarly, the contact 16d is electrically connected to the conductive layer 10j with a diameter size smaller than the diameter size of the support pillar 14d at a position of penetrating through the conductive layers 10d, 10f, and 10h at the region position on the inner side in the radial direction of the support pillar 14d in the staircase region. In addition, in the example of FIG. 1, the contact 16d is electrically connected to the conductive layer 10j with a diameter size smaller than the diameter size of the support pillar 14d at a position of being connected to the conductive layer 10j at the region position on the inner side in the radial direction of the support pillar 14d in the staircase region. The contact 16d extends upward on the side opposite to the semiconductor substrate 200 with respect to the conductive layer 10j. In other words, each contact 16 is connected to the conductive layer 10 in the region of the cross section of the corresponding support pillar 14 as viewed from the upper side. In this manner, since each contact 16 having a smaller size than the support pillar 14 is connected to the conductive layer 10 at the region position on the inner side in the radial direction of the corresponding support pillar 14, even if the contact 16 penetrates through the conductive layer 10, merely by sticking into the support pillar 14 of the lower layer side, the contact 16 can be prevented from contacting the conductive layer 10 of the lower layer side.

Furthermore, the film thickness of the conductive layer 10 at the region position on the inner side in the radial direction of each support pillar 14 is formed to be larger than the film thickness of the conductive layer 10 in the region portion overlapping with the conductive layer 10 of a different terrace of the upper layer side in the staircase region. In the example of FIG. 1, the film thickness h1 of the conductive layer 10 (for example, the conductive layer 10d) on the uppermost surface of each terrace, which is a staircase shaped protruding end portion including the region position on the inner side in the radial direction of each support pillar 14 (for example, the support pillar 14a) is formed to be larger than the film thickness of the conductive layer 10 (for example, the conductive layer 10d) in the region portion overlapping with the conductive layer 10 (for example, the conductive layer 10f) of a different terrace of the upper layer side. In addition, in the example of FIG. 1, a case where the film thickness becomes large toward the upper side is illustrated. By increasing the film thickness of the portion of the conductive layer connected to the contact 16, the contact 16 is hard to penetrate through the conductive layer 10, and a large contact area between the contact 16 and the conductive layer 10 can be allocated, so that a process margin at the time of forming the contact can be increased from the such a point.

In addition, when the film thickness of the conductive layer 10 of the uppermost surface of each terrace becomes large, the distance from the conductive layer 10 of the upper layer side of the one layer becomes short. For this reason, there is a possibility that contact with the conductive layer 10 of the upper layer side becomes a problem. In Embodiment 1, the opening groove 17 is formed between the root of the staircase shaped protruding end portion of each conductive layer 10 and the dielectric layer on each conductive layer 10. The opening groove 17 is formed below the upper surface of the conductive layer 10 in a region portion overlapping with the conductive layer 10 of the upper layer side of the one layer. Specifically, as illustrated in FIG. 1, by forming the opening groove 17 at the root of the protruding end portion in each terrace, it is possible to avoid the contact with the conductive layer 10 of the upper layer side, so that the insulation property can be improved.

In addition, since only one support pillar 14 is arranged with respect to the terrace of each layer, the terrace area can be allowed to be smaller than that of Comparative Example. In addition, in Embodiment 1, as illustrated in FIG. 2C, there is not excluded a case where, besides the support pillar 14 which is thicker than each contact 16 arranged at a position overlapping with each contact 16, additionally one or a plurality of the support pillars 15 (which may be thick or thin) are arranged at positions not overlapping with each contact 16.

In addition, in the memory cell region, a pillar-shaped channel body 21 penetrating through the stacked body of the conductive layers 10 of the plurality of layers and the dielectric layers 12 of the plurality of layers in a stacking direction perpendicular to the stacking surface is arranged. A semiconductor material is used as a material of the channel body 21. In addition, in the memory cell region, a memory film 20 including a charge accumulation film is arranged between each conductive layer 10 and the channel body 21. The memory film 20 is arranged in a cylindrical shape penetrating through the stacked body of the conductive layers 10 of the plurality of layers and the dielectric layers 12 of the plurality of layers in the stacking direction so as to surround the entire side surface of the channel body 21. One memory cell is configured with a combination of the conductive layer 10 serving as a word line, the memory film 20, and the channel body 21 surrounded by the memory film 20. One NAND string is configured with a plurality of memory cells connecting memory cells in the conductive layer 10 of each layer through which the same channel body 21 and memory film 20 penetrate. In addition, in the conductive layer 10 of one layer, a plurality of channel bodies 21 and the memory films 20 surrounding the respective channel bodies 21 are arranged. In the example of FIG. 1, a combination of three channel bodies 21 and memory films 20 is illustrated. One end of each channel body 21 is connected to another bit line contact (not illustrated), for example, in a layer upper than the stacked body. The other end of each channel body 21 is connected to a common source line (not illustrated), for example, in a layer lower than the stacked body. In addition, each of the pillar-shaped channel bodies 21 may have a cylindrical-shaped structure having a bottom portion using a semiconductor material, and a core portion using a dielectric material may be arranged in the inside thereof.

Figure 3:
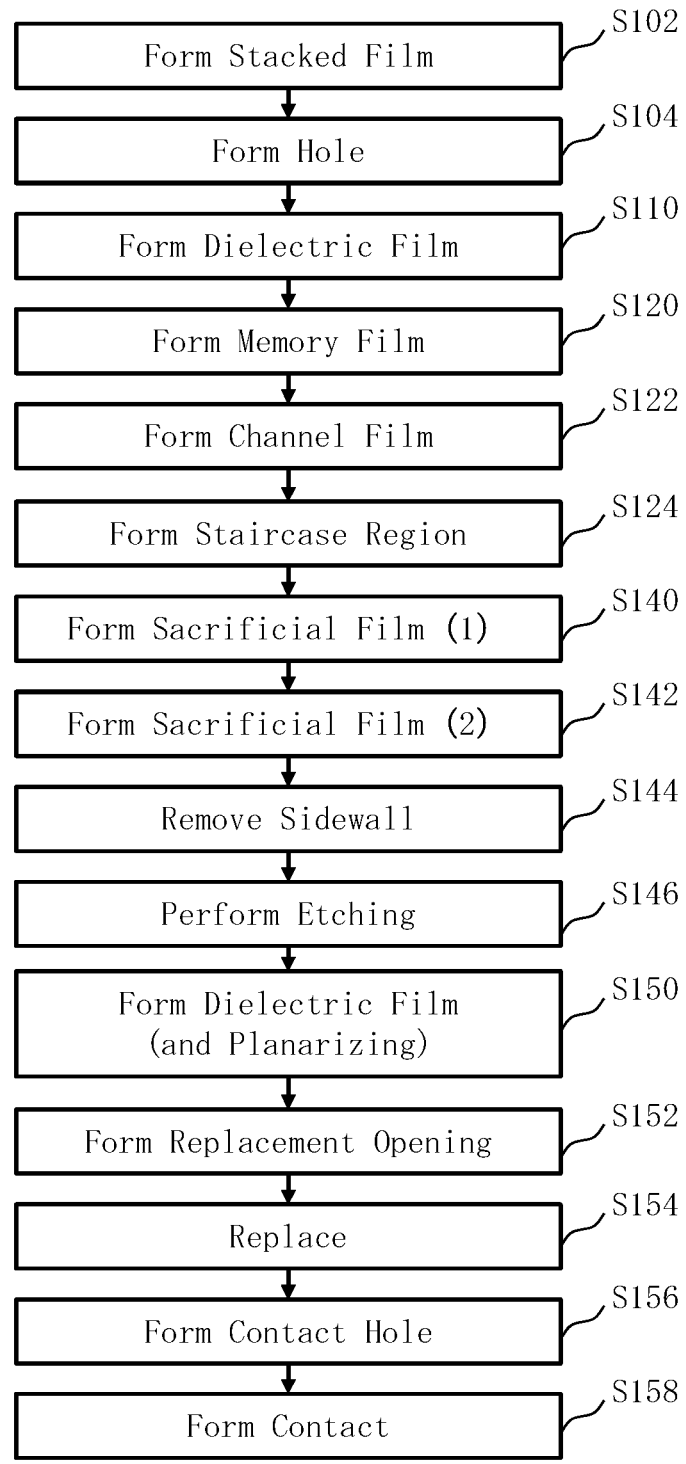
FIG. 3 is a flowchart illustrating main processes of a method of manufacturing the semiconductor device according to Embodiment 1.

FIG. 3 is a flowchart illustrating main processes of a method of manufacturing the semiconductor device according to Embodiment 1. In FIG. 3, in the method of manufacturing the semiconductor device according to Embodiment 1, a series of processes including a stacked film forming process (S102), a hole forming process (S104), a dielectric film forming process (S110), a memory film forming process (S120), a channel film forming process (S122), a staircase region forming process (S124), a sacrificial film (1) forming process (S140), a sacrificial film (2) forming process (S142), a sidewall removing process (S144), an etching process (S146), a dielectric film forming/planarizing process (S150), a replacement opening forming process (S152), a replacing process (S154), a contact hole forming process, (S156), and a contact forming process (S158) are performed.

Figure 4:
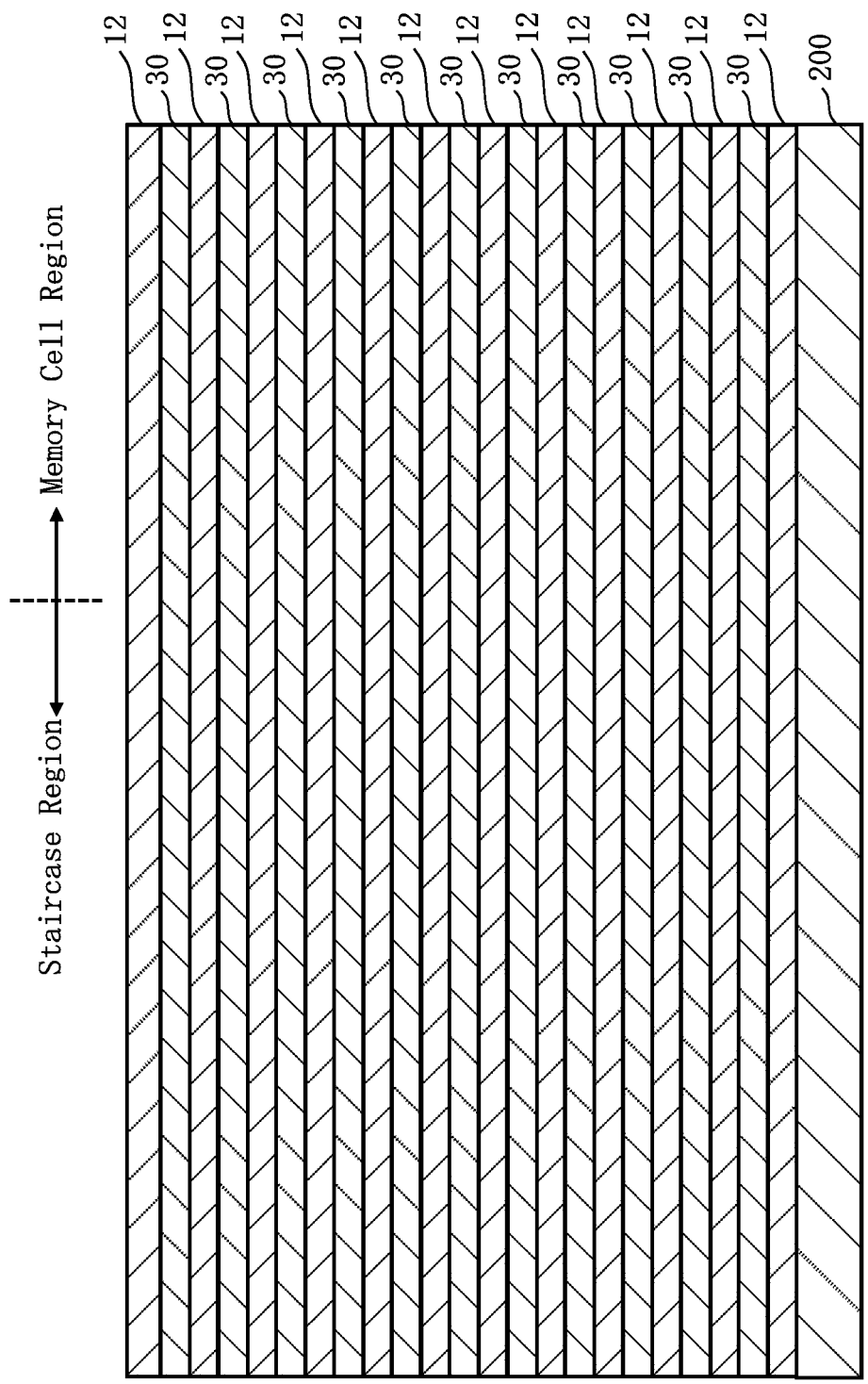
FIG. 4 is a cross-sectional view illustrating a portion of the processes of the method of manufacturing the semiconductor device according to Embodiment 1.

FIG. 4 is a cross-sectional view illustrating a portion of the processes of the method of manufacturing the semiconductor device according to Embodiment 1. In FIG. 4, the stacked film forming process (S102) of FIG. 3 is illustrated. The subsequent processes will be described later.

In FIG. 4, as the stacked film forming process (S102), first, a sacrificial film layer 30 and the dielectric layer 12 are alternately stacked on the semiconductor substrate 200 by using, for example, an atomic layer deposition (ALD) method, an atomic layer chemical vapor deposition (AL-CVD) method, or a chemical vapor deposition (CVD) method. In the example of FIG. 4, a case where, first, after the dielectric layer 12 is formed on the semiconductor substrate 200, the sacrificial film layer 30 and the dielectric layer 12 are alternately stacked, and the dielectric layer 12 is formed on the uppermost layer is illustrated. By such a process, a stacked film (stacked body) is formed in which the sacrificial film layer 30 of each layer of the sacrificial film layers 30 of a plurality of layers and the dielectric layer 12 of each of the dielectric layer 12 of a plurality of layers are alternately stacked. For example, a silicon nitride film (SiN film) is preferably used as the sacrificial film used for the sacrificial film layer 30. As a dielectric film used for the dielectric layer 12, for example, it is preferable to use a silicon oxide film ($SiO_2$ film). In addition, for example, a silicon wafer having a diameter of 300 mm is used as a semiconductor substrate. In addition, semiconductor elements such as other dielectric films (not illustrated), wires, contacts and/or transistors (not illustrated) may be formed on the semiconductor substrate or in the semiconductor substrate on which the sacrificial film layer 30 and the dielectric layer 12 are alternately stacked.

Figure 5:
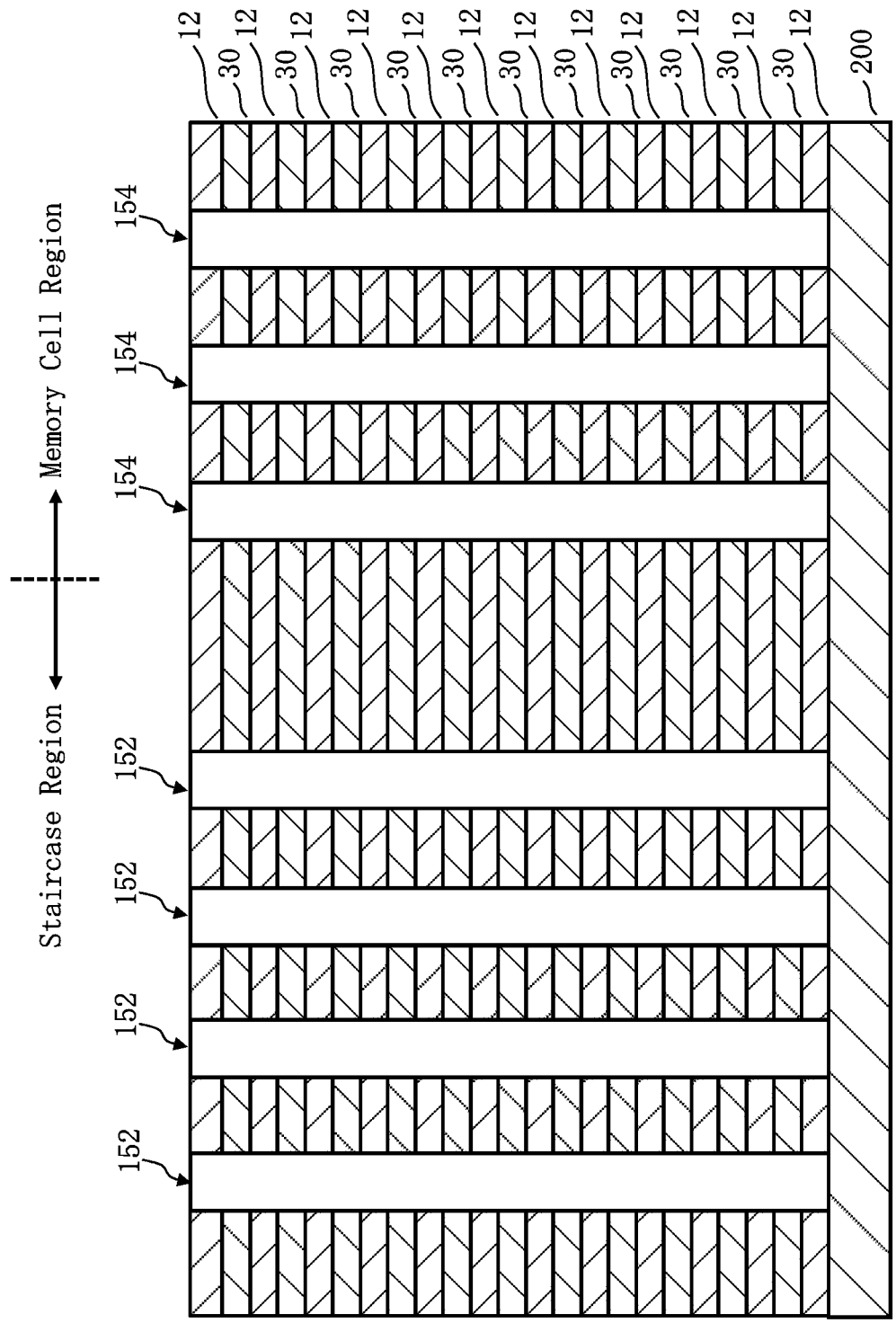
FIG. 5 is a cross-sectional view illustrating a portion of the processes of the method of manufacturing the semiconductor device according to Embodiment 1.

FIG. 5 is a cross-sectional view illustrating a portion of the processes of the method of manufacturing the semiconductor device according to Embodiment 1. In FIG. 5, the hole forming process (S104) of FIG. 4 is illustrated. The subsequent processes will be described later.

In FIG. 5, as the hole forming process (S104), for example, a circular opening (hole 152) penetrating through the stacked film from an upper portion above the dielectric layer 12 of the uppermost layer of the stacked film is formed. Herein, a plurality of holes 152 for forming a support pillar are formed in a region to be a staircase region later. In addition, it is preferable to simultaneously form a plurality of memory holes 154 in the memory cell region. The plurality of holes 152 for forming the support pillars and the plurality of memory holes 154 are not limited to a case where the holes and the memory holes are formed together, and the holes and the memory holes may be separately formed. In a state in which a resist film is formed on the dielectric layer 12 through a lithography process such as a resist coating process and an exposing process (not illustrated), the exposed dielectric layer 12, and the stacked layer of the sacrificial film layer 30 and the dielectric layer 12 located in the lower layer thereof is removed by an anisotropic etching method, so that it is possible to form the hole 152 and the memory hole 154 substantially vertically to the surface of the dielectric layer 12. For example, as one example, the hole 152 and the memory hole 154 may be formed by a reactive ion etching (RIE) method. In addition, in Embodiment 1, the stacked body is formed so that, out of the sacrificial film layer 30 and the dielectric layer 12, the dielectric layer 12 is the exposed surface. Therefore, the film quality of the sacrificial film of the sacrificial film layer 30 can be prevented from being damaged by lithography processing or the like. As a result, incomplete replacement in the later-described replacing process (S154) can be suppressed.

Figure 6:
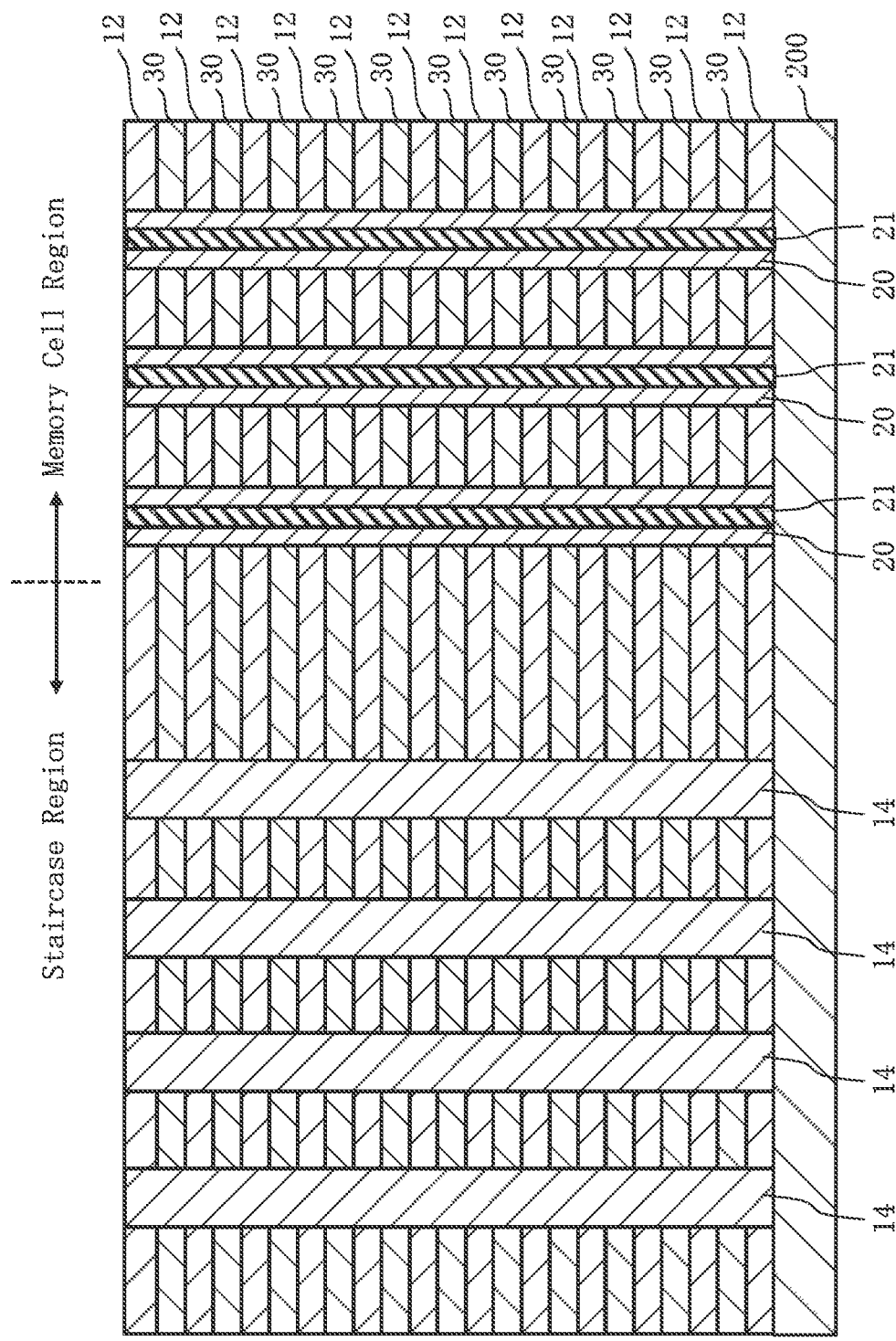
FIG. 6 is a cross-sectional view illustrating a portion of the processes of the method of manufacturing the semiconductor device according to Embodiment 1.

FIG. 6 is a cross-sectional view illustrating a portion of the processes of the method of manufacturing the semiconductor device according to Embodiment 1. In FIG. 6, the processes from the dielectric film forming process (S110) to the channel film forming process (S122) in FIG. 3 are illustrated. The subsequent processes will be described later. Either of the dielectric film forming process (S110) and the memory film forming process (S120) may be first performed. However, the channel film forming process (S122) is performed after the memory film forming process (S120).

In FIG. 6, first, as the dielectric film forming process (S110), a dielectric film for the support pillar 14 is formed in the hole 152 by using, for example, an ALD method, an ALCVD method, or a CVD method. Herein, it is preferable that deposition is performed until the inside of the hole 152 is completely filled with the dielectric film for the support pillar 14. For example, a $SiO_2$ film is preferably used as the dielectric film for the support pillar 14.

Next, as the memory film forming process (S120), the memory film 20 is formed in each memory hole 154.

Figure 7:
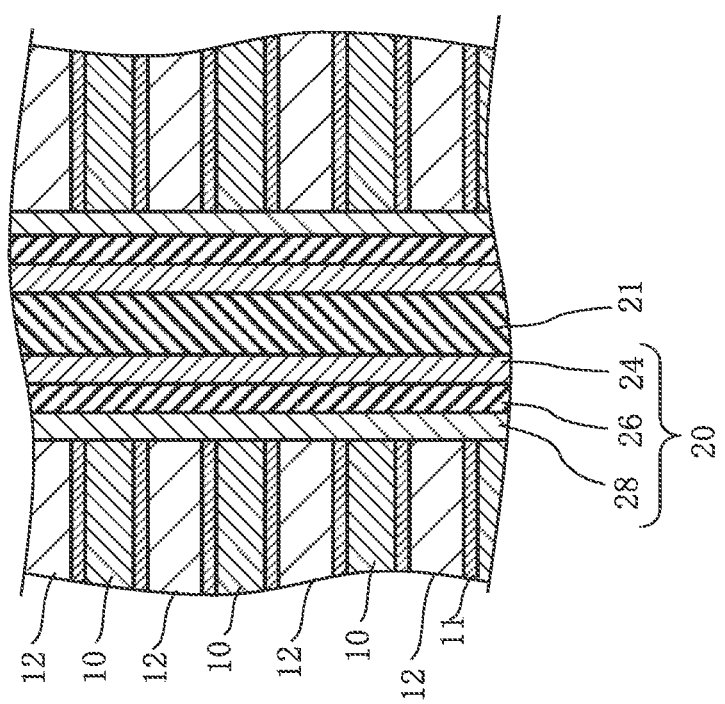
FIG. 7 is a cross-sectional view illustrating an example of the configuration of a memory cell region in Embodiment 1.

FIG. 7 is a cross-sectional view illustrating an example of the configuration of the memory cell region in Embodiment 1. In FIG. 7, a state after the sacrificial film layer 30 is replaced with the conductive layer 10 (a barrier metal film 11 and a metal film) is illustrated. The memory film 20 includes a block dielectric film 28, a charge accumulation film 26, and a tunnel dielectric film 24. Hereinafter, the internal process will be described in detail.

As the block film forming process, the block dielectric film 28 is formed along the sidewall surface of each memory hole 154 by using, for example, an ALD method, an ALCVD method, or a CVD method. The block dielectric film 28 is a film that suppresses the flow of charges between the charge accumulation film 26 and the conductive layer 10. For example, an aluminum oxide ($Al_2O_3$) or $SiO_2$ film is preferably used as the material of the block dielectric film 28. Therefore, the block dielectric film 28 arranged in a cylindrical shape along the sidewall surface of the memory hole 154 can be formed as a portion of the memory film 20.

Next, as the charge accumulation film forming process, the charge accumulation film 26 is formed along the sidewall surface of the block dielectric film 28 in each memory hole 154 by using, for example, an ALD method, an ALCVD method, or a CVD method. The charge accumulation film 26 is a film containing a material capable of storing charges. For example, SiN is preferably used as the material of the charge accumulation film 26. Therefore, the charge accumulation film 26 arranged in a cylindrical shape along the inner sidewall surface of the block dielectric film 28 can be formed as a portion of the memory film 20.

Next, as the tunnel dielectric film forming process, the tunnel dielectric film 24 is formed along the sidewall surface of the charge accumulation film 26 in each memory hole 154 by using, for example, an ALD method, an ALCVD method, or a CVD method. The tunnel dielectric film 24 is a dielectric film that has an insulation property but allows a current to flow by a predetermined applied voltage. For example, $SiO_2$ is preferably used as the material of the tunnel dielectric film 24. Therefore, the tunnel dielectric film 24 arranged in a cylindrical shape along the inner sidewall surface of the charge accumulation film 26 can be formed as a portion of the memory film 20.

In the above example, although a case where the block dielectric film 28 is formed before the formation of the charge accumulation film 26 is illustrated, embodiments are not limited to this case. In the memory film forming process (S120), the charge accumulation film 26 and the tunnel dielectric film 24 may be formed, and in the replacing process (S154) described later, before burying the barrier metal film and the conductive material, the block dielectric film 28 may be formed through the replacement opening described later.

Next, as the channel film forming process (S122), a channel film to be the channel body 21 is formed in a pillar shape along the inner sidewall surface of the tunnel dielectric film 24 in each memory hole 154 by using, for example, an ALD method, an ALCVD method, or a CVD method. As a material of the channel film, a semiconductor material is used. For example, it is preferable to use silicon (Si) doped with impurities. Therefore, the channel body 21 can be formed in a pillar shape along the entire inner sidewall surfaces of the tunnel dielectric film 24.

Figure 8:
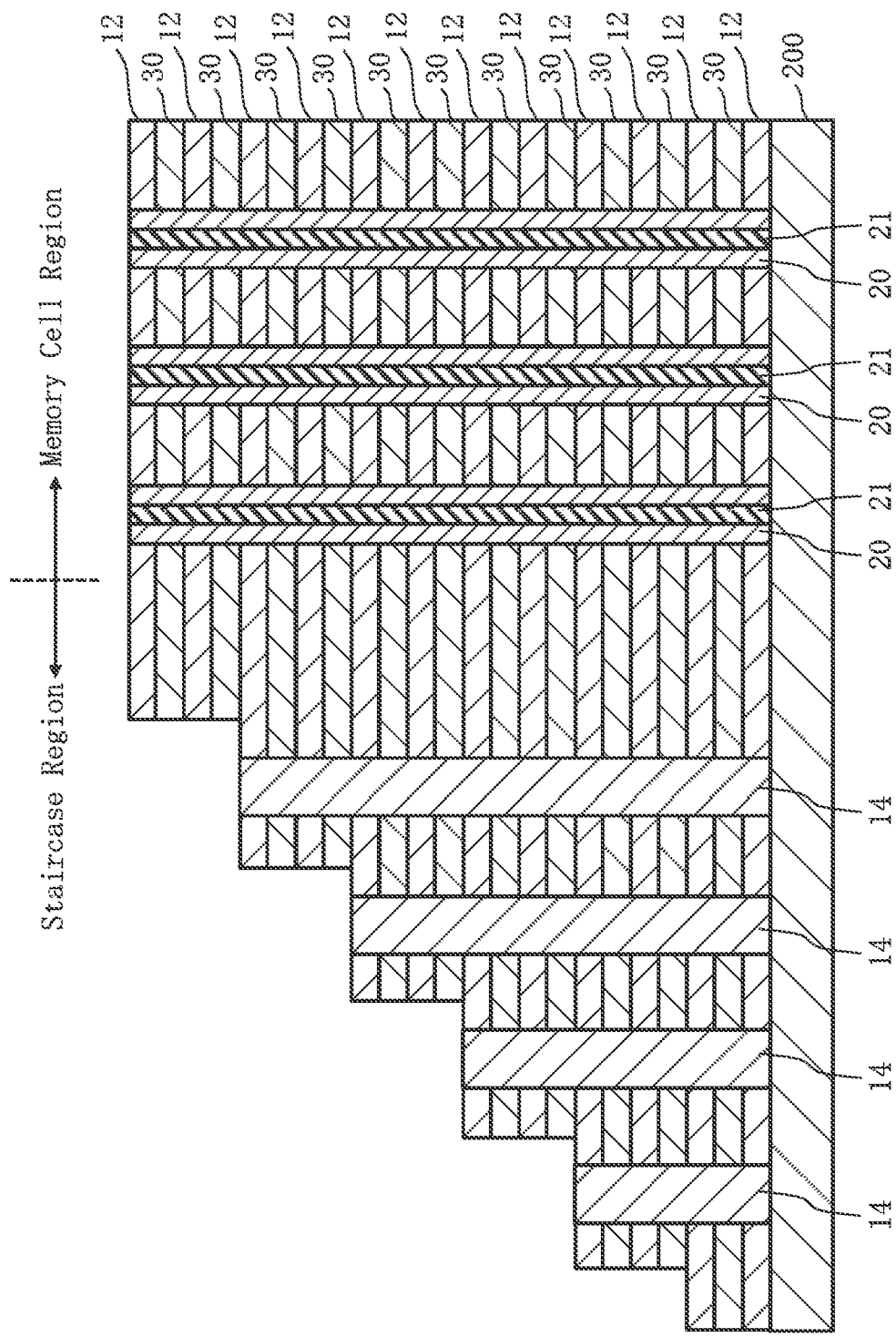
FIG. 8 is a cross-sectional view illustrating a portion of the processes of the method of manufacturing the semiconductor device according to Embodiment 1.

FIG. 8 is a cross-sectional view illustrating a portion of the processes of the method of manufacturing the semiconductor device according to Embodiment 1. In FIG. 8, the staircase region forming process (S124) of FIG. 3 is illustrated. The subsequent processes will be described later.

In FIG. 8, as the staircase region forming process (S124), the stacked film is processed into a staircase shape. A resist film is formed on the stacked film in which the sacrificial film layer 30 and the dielectric layer 12 are alternately stacked. Patterning is performed to expose the region which is to be the terrace of the lowermost layer in the staircase region. Then, for example, an anisotropic etching process such as RIE using the resist film as a mask and a slimming process such as asking for reducing the volume of the resist film are alternately repeated. By the anisotropic etching process, the dielectric layer 12 for two layers and the sacrificial film layer 30 for two layers are selectively removed. Then, by the slimming process, the side surface of the resist film is recessed to expose the region which is to be a new terrace in the stacked body. By alternately repeating the anisotropic etching process and the slimming process, as illustrated in FIG. 8, each terrace having a staircase shape are formed in the stacked body. In addition, in the example of FIG. 8, a case where the set of the sacrificial film layer 30 and the dielectric layer 12 is processed so as to have a staircase shape on a terrace configured with, for example, two layers is illustrated. In addition, the set of the sacrificial film layer 30 and the dielectric layer 12 is processed so as to have a staircase shape in which the lower layer side further protrudes by one layer on the back side toward the paper surface of FIG. 8. Such processing may also be performed by the patterning and the anisotropic etching process.

Herein, in the case of forming each terrace having a staircase shape, it is preferable that, out of the sacrificial film layer 30 and the dielectric layer 12, the dielectric layer 12 is formed so as to be the exposed surface. Therefore, the film quality of the sacrificial film of the sacrificial film layer 30 can be prevented from being damaged by lithography processing or the like. As a result, incomplete replacement in the later-described replacing process (S154) can be suppressed.

Figure 9:
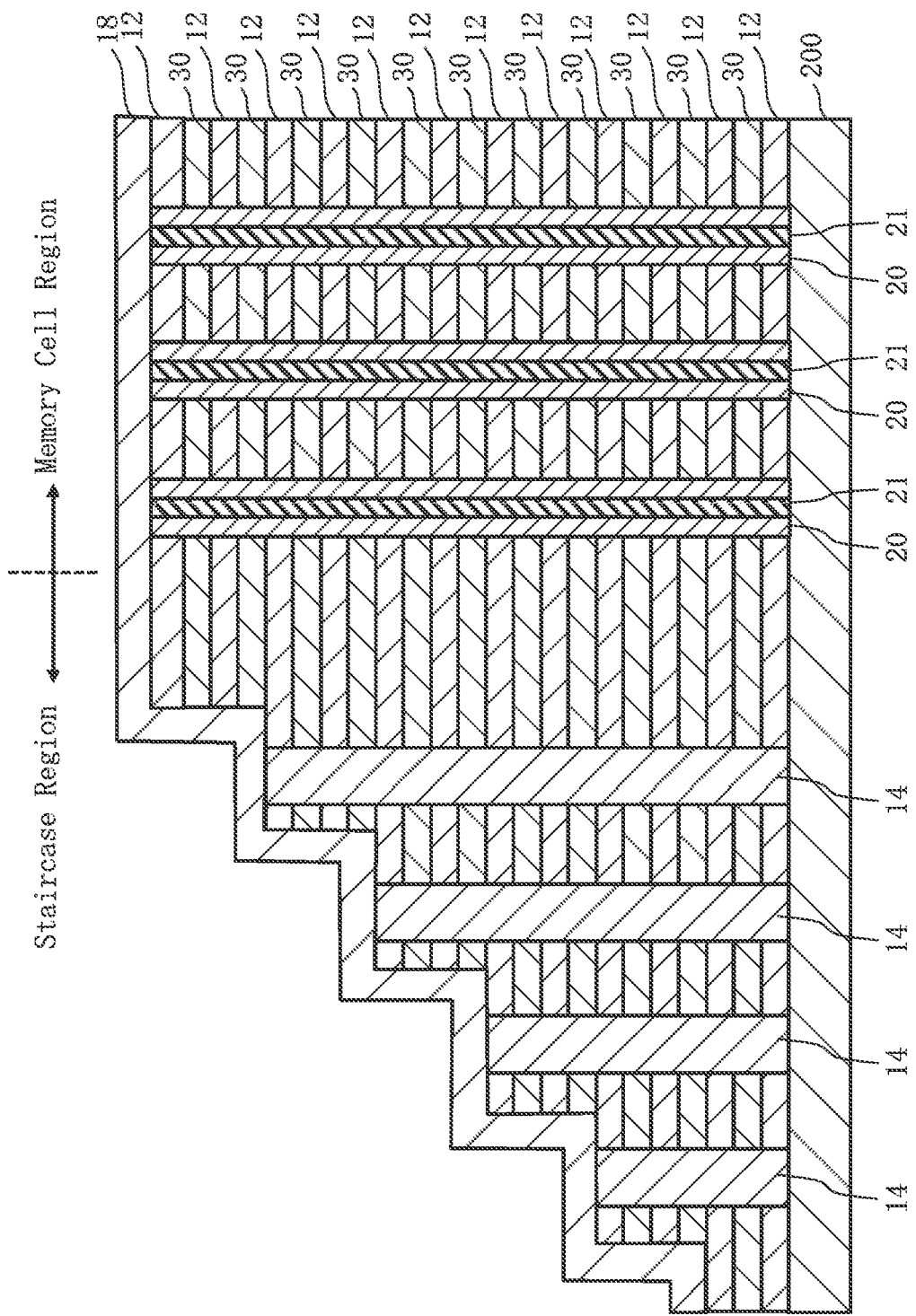
FIG. 9 is a cross-sectional view illustrating a portion of the processes of the method of manufacturing the semiconductor device according to Embodiment 1.

FIG. 9 is a cross-sectional view illustrating a portion of the processes of the method of manufacturing the semiconductor device according to Embodiment 1. In FIG. 9, the sacrificial film (1) forming process (S140) of FIG. 3 is illustrated. The subsequent processes will be described later.

In FIG. 9, as the sacrificial film (1) forming process (S140), a sacrificial film 18 is formed on the exposed dielectric layer 12 having a staircase shape by using, for example, an ALD method, an ALCVD method, or a CVD method. In the example of FIG. 9, the sacrificial film 18 is formed to be thicker than the sacrificial film of the sacrificial film layer 30. The same material as the sacrificial film layer 30 is used as the material of the sacrificial film 18. In this case, it is preferable to use SiN.

Figure 10:
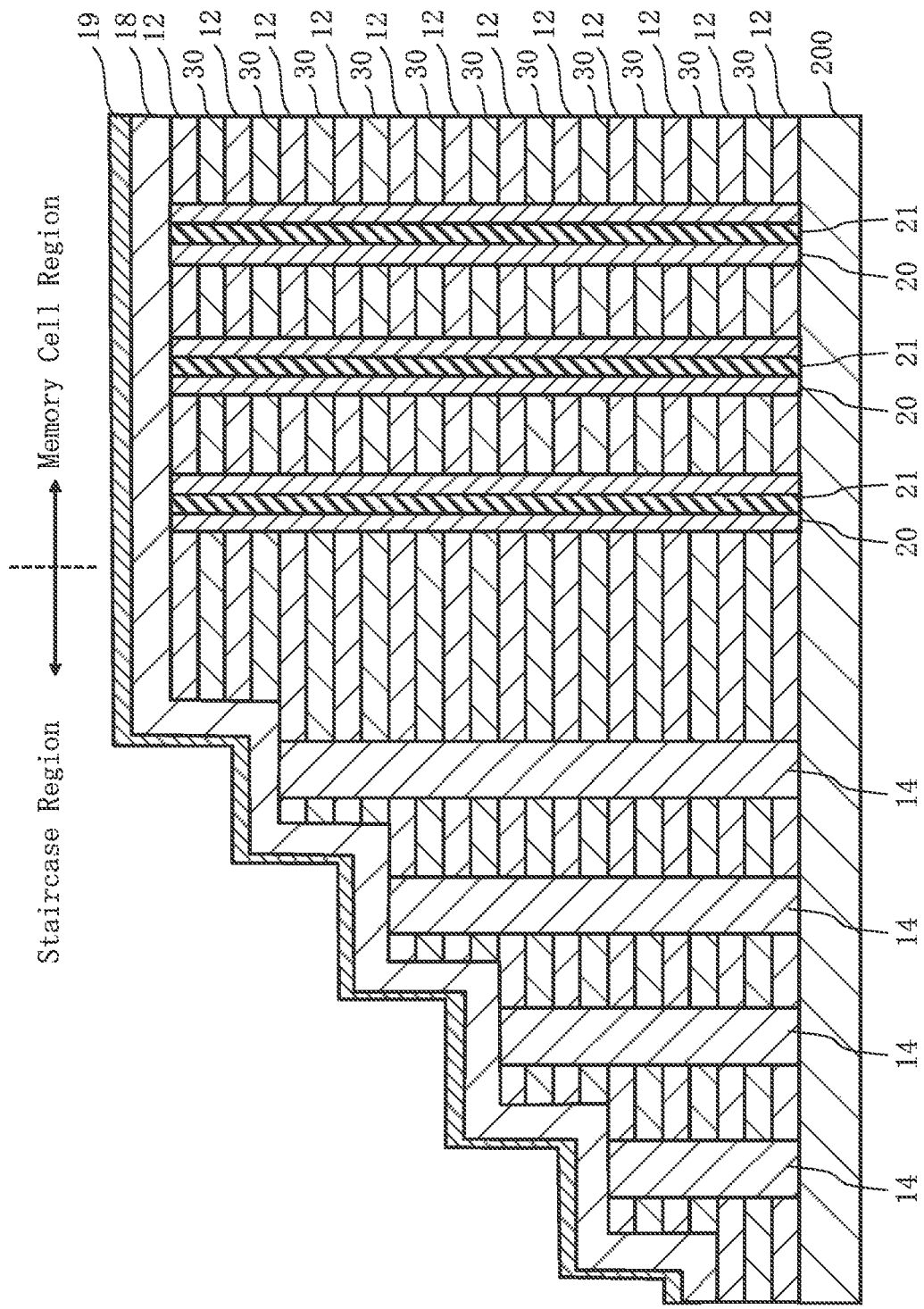
FIG. 10 is a cross-sectional view illustrating a portion of the processes of the method of manufacturing the semiconductor device according to Embodiment 1.

FIG. 10 is a cross-sectional view illustrating a portion of the processes of the method of manufacturing the semiconductor device according to Embodiment 1. In FIG. 10, the sacrificial film (2) forming process (S142) of FIG. 3 is illustrated. The subsequent processes will be described later.

In FIG. 10, as the sacrificial film (2) forming process (S142), a sacrificial film 19 using a material having different etching resistance is formed on the sacrificial film 18 by using, for example, an ALD method, an ALCVD method, or a CVD method. It is preferable that, as the sacrificial film 19, a carbon film is formed under conditions of poor coverage.

Figure 11A:
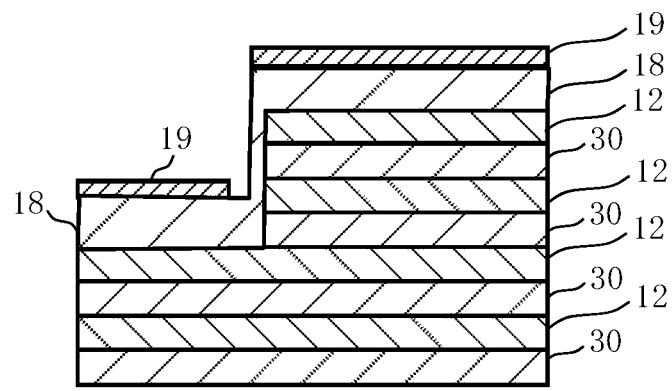
FIGS. 11A and 11B are cross-sectional views illustrating a portion of the processes of the method of manufacturing the semiconductor device according to Embodiment 1.
Figure 11B:
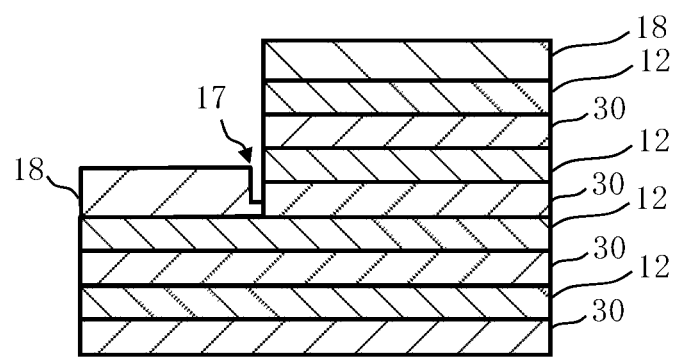
Figure 12:
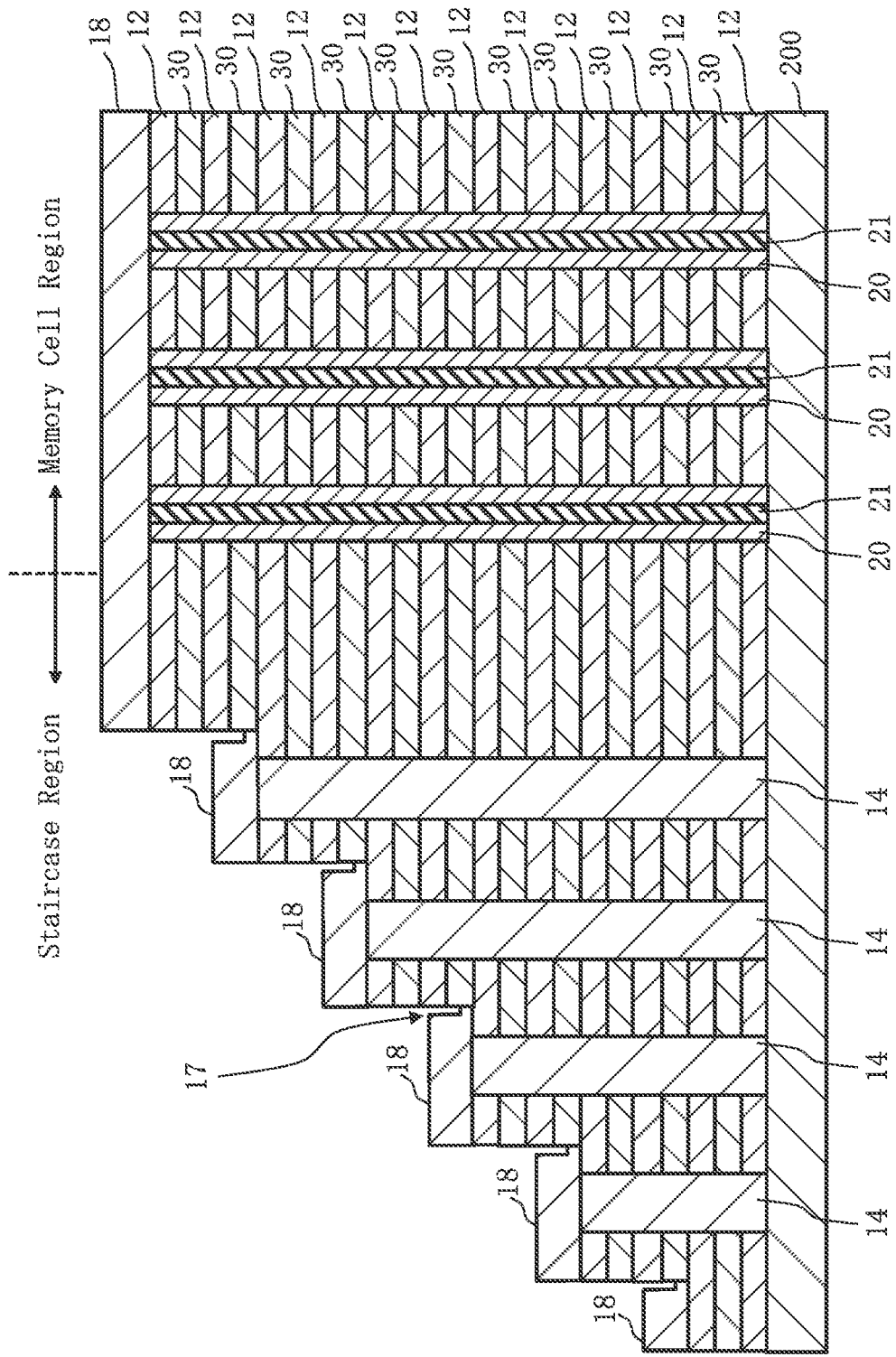
FIG. 12 is a cross-sectional view illustrating a portion of the processes of the method of manufacturing the semiconductor device according to Embodiment 1.

FIGS. 11A and 11B are cross-sectional views illustrating a portion of the processes of the method of manufacturing the semiconductor device according to Embodiment 1. FIG. 12 is a cross-sectional view illustrating a portion of the processes of the method of manufacturing the semiconductor device according to Embodiment 1. In FIGS. 11A and 11B, the sidewall removing process (S144) and the etching process (S146) in FIG. 3 are illustrated. FIG. 12 illustrates the state after the etching process (S146) of FIG. 3. The subsequent processes will be described later.

In FIG. 11A, as the sidewall removing process (S144), the sacrificial film 19 formed on the sidewall of the sacrificial film 18 is removed by etching, and in a state where the sacrificial film 19 on the sacrificial film 18 is allowed to remain, the sidewalls of the sacrificial film 18 is exposed. At that time, the film thickness of the sidewall of the sacrificial film 18 can be allowed to be small.

In FIGS. 11B and 12, as the etching process (S146), by an isotropic etching process, the sidewall of the sacrificial film 18 is removed while removing the sacrificial film 19 on the sacrificial film 18. At that time, since the lower portion of the sidewall of the sacrificial film 18 is etched isotropically to the lower layer side, the groove 17 can be formed from the exposed surface side of the sacrificial film 18 at the root of the terrace having a staircase shape. By such a process, the film thickness of the sacrificial film 18 located on the terrace portion having a staircase shape arranged on each of the support pillars 14 is formed to be larger than the film thickness of the sacrificial film layer 30 in the stacked body.

Figure 13:
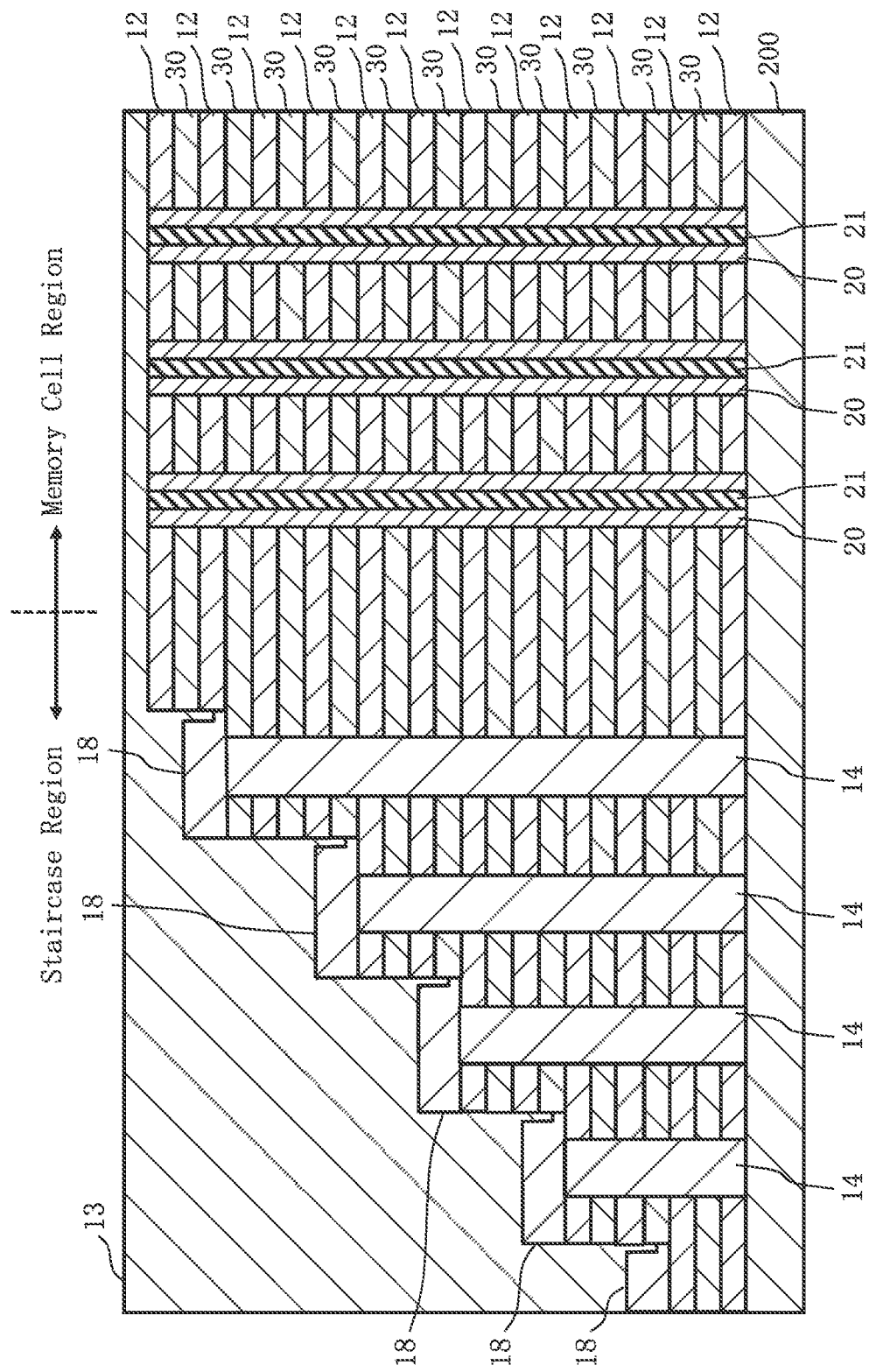
FIG. 13 is a cross-sectional view illustrating a portion of the processes of the method of manufacturing the semiconductor device according to Embodiment 1.

FIG. 13 is a cross-sectional view illustrating a portion of the processes of the method of manufacturing the semiconductor device according to Embodiment 1. In FIG. 13, the dielectric film forming/planarizing process (S150) of FIG. 3 is illustrated. The subsequent processes will be described later.

In FIG. 13, as the dielectric film forming/planarizing process (S150), the dielectric film 13 is formed in the staircase region and the memory cell region by using, for example, an ALD method, an ALCVD method, or a CVD method, and after, planarizing is performed. For example, $SiO_2$ is preferably used as the dielectric film 13.

Figure 14:
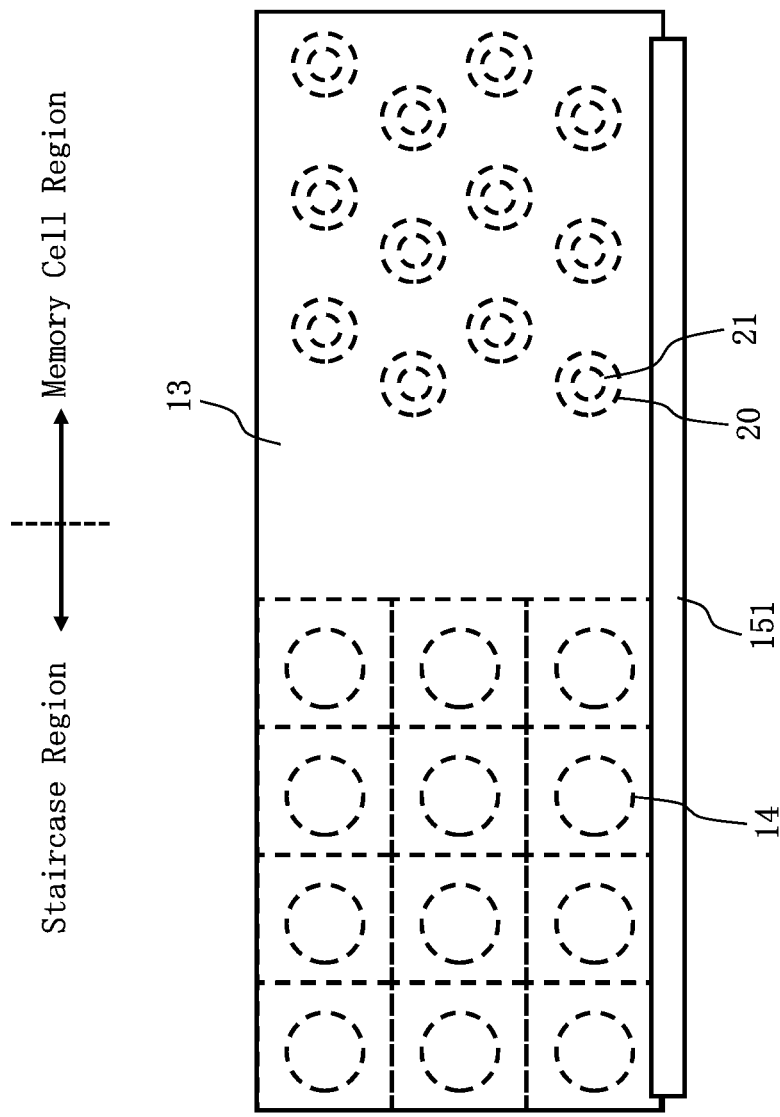
FIG. 14 is a top view illustrating a portion of the processes of the method of manufacturing the semiconductor device according to Embodiment 1.

FIG. 14 is a top view illustrating a portion of the processes of the method of manufacturing the semiconductor device according to Embodiment 1. In FIG. 14, the replacement opening forming process (S152) of FIG. 3 is illustrated. The subsequent processes will be described later.

In FIG. 14, as the replacement opening forming process (S152), for example, an opening (a groove 151) penetrating through the stacked body of the sacrificial film layer 30 and the dielectric layer 12 from an upper portion above the dielectric film 13 is formed extending from the memory cell region to the staircase region. The groove 151 is formed at a position not overlapping with the memory film 20 and at a position not overlapping with the support pillar 14. In addition, the opening position of the groove 151 may be in only the memory cell region or in only the staircase region. In addition, although a case where the groove 151 is formed is illustrated herein, embodiments are not limited to this case. A hole such as a circle penetrating through the stacked body of the sacrificial film layer 30 and the dielectric layer 12 from an upper portion above the dielectric film 13 may be formed. In addition, the opening position of the hole may be in a memory cell region or in a staircase region.

Figure 15:
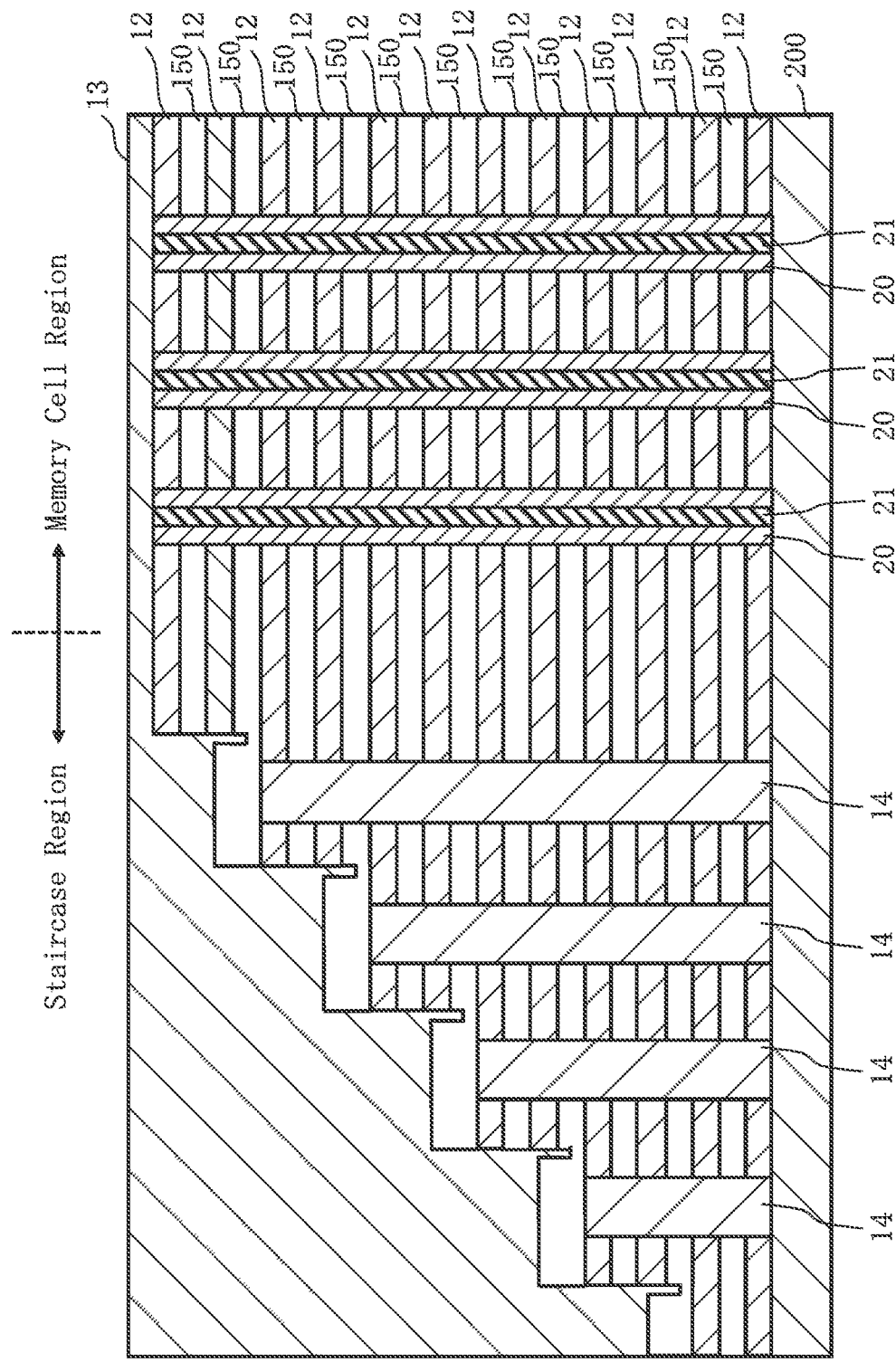
FIG. 15 is a cross-sectional view illustrating a portion of the processes of the method of manufacturing the semiconductor device according to Embodiment 1.

FIG. 15 is a cross-sectional view illustrating a portion of the processes of the method of manufacturing the semiconductor device according to Embodiment 1. In FIG. 15, a portion of the replacing process (S154) of FIG. 3 is illustrated. The subsequent processes will be described later.

In FIG. 15, as a portion of the replacing process (S154), the sacrificial film layer 30 and the sacrificial film 18 of each layer are removed by etching through the replacement groove 151 by a wet etching method (for example, hot phosphoric acid treatment). Therefore, as illustrated in FIG. 15, a space 150 is formed between the dielectric layers 12 of each layer. In addition, the terrace portion in the staircase region in which the sacrificial film 18 has existed is also a portion of the space 150. In the staircase region, the support pillar 14 extending in a direction perpendicular to the dielectric layer 12 of each layer serves as a support member (pillar), so that the dielectric layer 12 of each layer can be supported so as not to collapse. In the memory cell region, the memory film 20 and the channel body 21 extending in a direction perpendicular to the dielectric layer 12 of each layer serve as support members (pillars), so that the dielectric layer 12 of each layer can be supported so as not to collapse.

Figure 16:
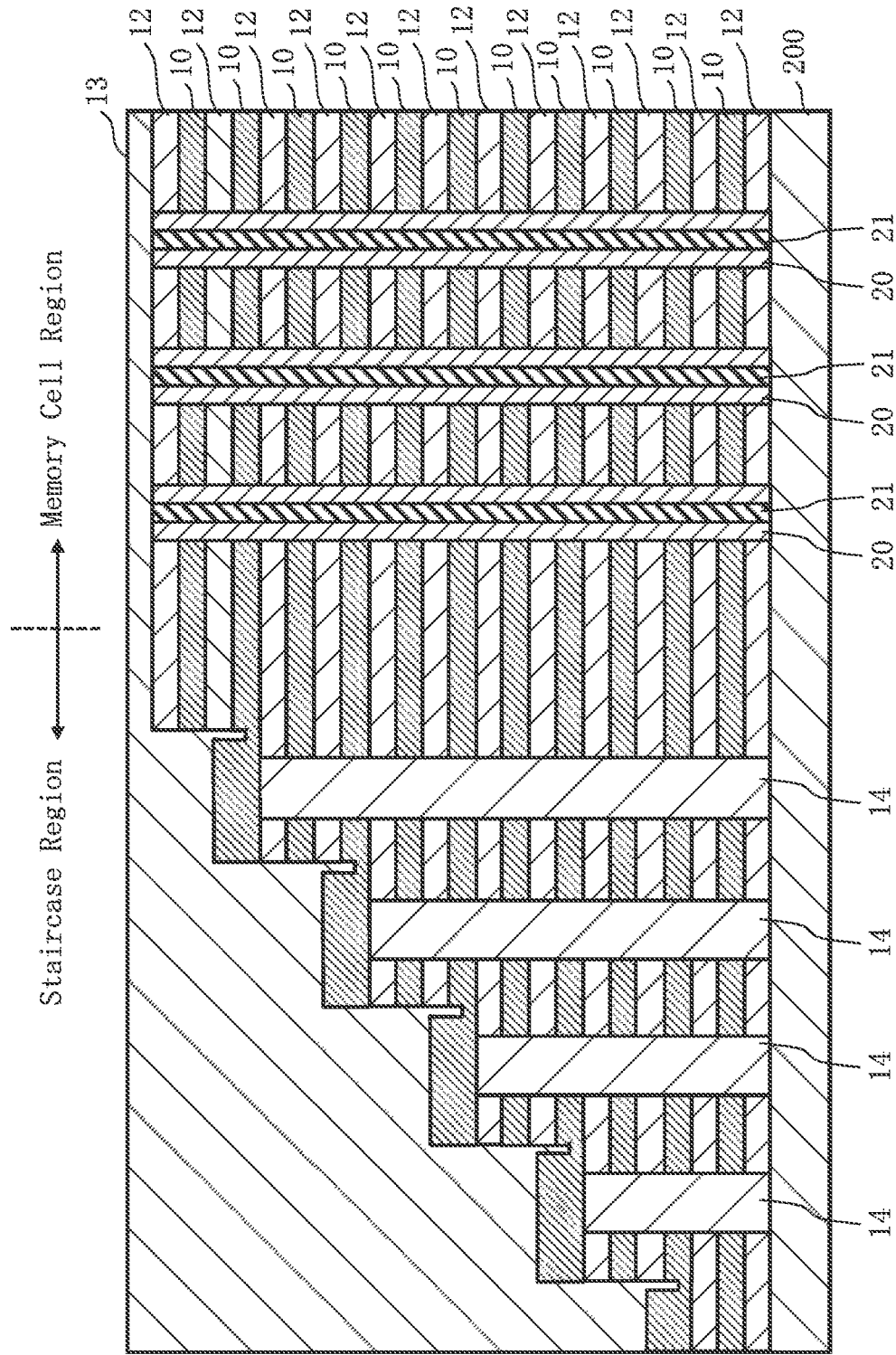
FIG. 16 is a cross-sectional view illustrating a portion of the processes of the method of manufacturing the semiconductor device according to Embodiment 1.

FIG. 16 is a cross-sectional view illustrating a portion of the processes of the method of manufacturing the semiconductor device according to Embodiment 1. In FIG. 16, the remaining portion of the replacing process (S154) of FIG. 3 is illustrated. The subsequent processes will be described later.

In FIG. 16, as the remaining portion of the replacing process (S154), the barrier metal film 11 illustrated in FIG. 7 is first formed on the upper and lower wall surfaces and the sidewall of the space 150 between the dielectric layers 12 and between the dielectric layers 12 and 13 of each layer through the replacement groove 151 by using an ALD method, an ALCVD method, or an CVD method. After that, the conductive layer 10 is formed by burying a conductive material serving as a word line in the space 150 between the dielectric layers 12 and between the dielectric layers 12 and 13 of each layer by using an ALD method, an ALCVD method, or a CVD method. For example, titanium nitride (TiN) is preferably used as the barrier metal film 11. In addition, tungsten (W) is preferably used as the conductive material of the conductive layer 10.

By such a process, as illustrated in FIG. 7, when, for example, $Al_2O_3$ is used as the material of the block dielectric film 28, it is possible to form a memory cell having a MANOS structure with metal (M)-aluminum oxide (A)-nitride film (N)-oxide film (O)-silicon (S).

Alternatively, when a $SiO_2$ film is used as the block dielectric film 28, it is possible to form a memory cell having a MONOS structure with metal (M)-oxide film (O)-nitride film (N)-oxide film (O)-silicon (S).

Figure 17:
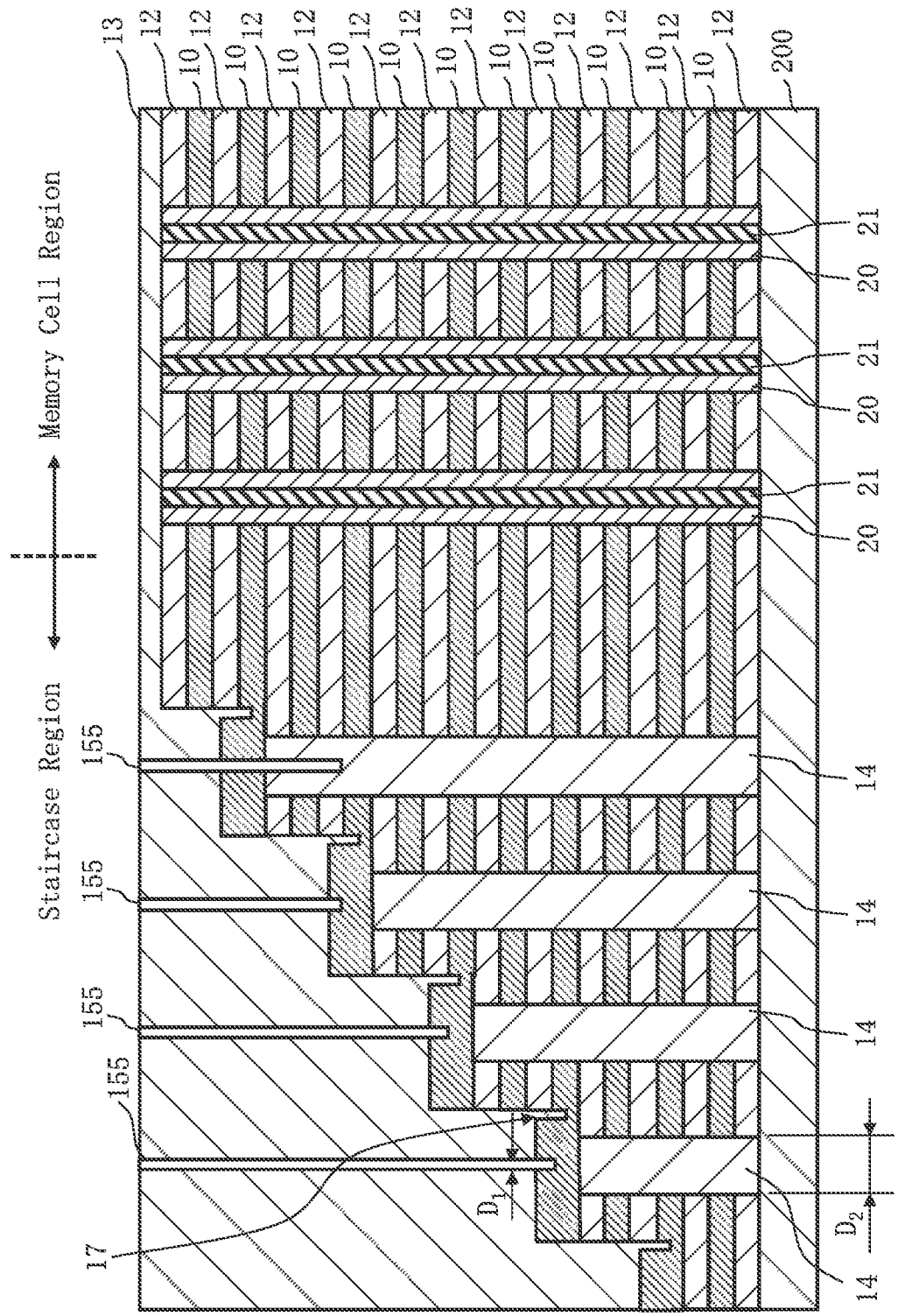
FIG. 17 is a cross-sectional view illustrating a portion of the processes of the method of manufacturing the semiconductor device according to Embodiment 1.

FIG. 17 is a cross-sectional view illustrating a portion of the processes of the method of manufacturing the semiconductor device according to Embodiment 1. FIG. 17 illustrates the contact hole forming process (S156) of FIG. 3. The subsequent processes will be described later.

In FIG. 17, as the contact hole forming process (S156), a contact hole 155 extending from an upper portion above the dielectric film 13 and reaching each conductive layer 10 located on each terrace in the staircase region is formed in the staircase region by using a lithography technique and an RIE method. Each contact hole 155 is opened so as to be located in the region on the inner side in the radial direction of the support pillar 14 below the corresponding conductive layer 10. In other words, each contact hole 155 is opened at a position not deviated from the region on the inner side in the radial direction of the support pillar 14 below the corresponding conductive layer 10. In addition, each contact hole 155 is formed with a diameter size D1 smaller than the diameter size D2 of the support pillar 14 at the height position of the upper surface or the lower surface of the conductive layer 10.

Then, as the contact forming process (S158), a conductive material is buried in the contact hole 155. For example, W is buried. Therefore, as illustrated in FIG. 1, each contact 16 having a size smaller than that of the support pillar 14 is connected to the conductive layer 10 at the region position on the inner side in the radial direction of the corresponding support pillar 14.

Besides, in the memory cell area, a bit line contact (not illustrated) and the like are connected to each channel body 21. Thus, the semiconductor device illustrated in FIG. 1 can be formed.

As described above, according to Embodiment 1, since the support pillar 14 made of a dielectric material having a size larger than the contact 16 is arranged on the lower layer side at the formation position of each contact 16, even when the contact 16 penetrates through the conductive layer 10 to be connected, it is possible to prevent contact with the conductive layer 10 of the lower layer side. In addition, since the film thickness of the conductive layer 10 to be connected becomes large, it is difficult for the contact 16 to penetrate through the conductive layer 10, so that it is possible to increase the process margin. In this manner, according to Embodiment 1, it is possible to avoid connection to the conductive layer 10 of the lower layer side in the contact connection of the word line of the three-dimensional NAND flash memory device.

Embodiment 2

Figure 19A:
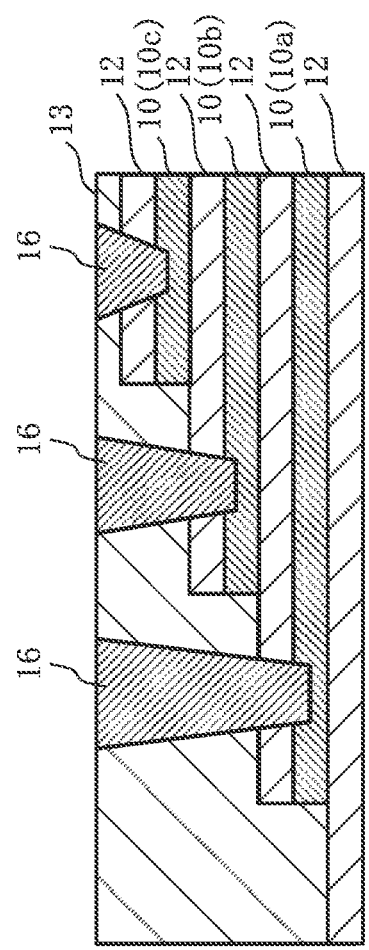
FIGS. 19A and 19B are views illustrating an example of the cross-sectional configuration of a semiconductor device and an example of the arrangement configuration of contacts and support pillars in a step region in Comparative Example of Embodiment 2.
Figure 19B:
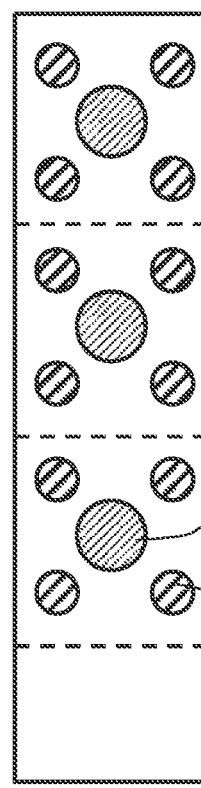

FIGS. 18A and 18B are views illustrating an example of the cross-sectional configuration of the semiconductor device according to Embodiment 2 and an example of an arrangement configuration of contacts and support pillars in a staircase region. FIGS. 19A and 19B are views illustrating an example of the cross-sectional configuration of a semiconductor device in Comparative Example of Embodiment 2 and an example of an arrangement configuration of contacts and support pillars in a staircase region. In FIGS. 18A and 19A, in all the semiconductor devices according to Embodiment 2 and Comparative Example, a conductive layer 10 of each layer among the conductive layers 10 of a plurality of layers serving as word lines (WL) in a semiconductor storage device and a dielectric layer 12 of each layer among the dielectric layers 12 of a plurality of layers insulating the conductive layers 10 of adjacent layers are alternately stacked above a semiconductor substrate 200 (substrate). Similarly to Embodiment 1, the conductive layer 10 of each layer is a plate-shaped layer extending in parallel with the surface of the semiconductor substrate 200 so as to spread over the staircase region (word line contact region) (first region) and the memory cell region (second region). In the examples of FIGS. 18A and 19A, the dielectric layer 12 is arranged on the semiconductor substrate 200 first, and the dielectric layer 12 is also arranged on the uppermost conductive layer 10. In FIG. 18A and 19A, the stacked body of the conductive layers 10 of the plurality of layers and the dielectric layers 12 of the plurality of layers is formed so as to have a staircase shape in which the lower layer side protrudes in the staircase region. In the examples of FIGS. 18A and 19A, a staircase shape is formed by terraces each of which is configured with, for example, one set layer being a set of the conductive layer 10 and the dielectric layer 12. In addition, the number of layers of set layers each being the set of the conductive layer 10 and the dielectric layer 12 is not limited to one set layer. The number of layers of the set layer may be two or more. In the example of FIGS. 18A and 19A, for example, the plate-shaped conductive layer 10a (an example of the first conductive layer) of the first layer is provided above the semiconductor substrate 200 and extends in parallel with the surface of the semiconductor substrate 200 so as to spread over the staircase region and the memory cell region. Then, the plate-shaped conductive layer 10b (an example of the second conductive layer) of the second layer is arranged to be separated at a distance above the conductive layer 10a so as to have a staircase shape in which the end portion of the conductive layer 10a protrudes, and extends in parallel with the conductive layer 10a so as to spread over the staircase region and the memory cell region. The plate-shaped conductive layer 10c of the third layer is arranged to be separated at a distance above the conductive layer 10b so as to have a staircase shape in which the end of the conductive layer 10b protrudes, and extends in parallel with the conductive layer 10b so as to spread over the staircase region and the memory cell region. Each terrace in the staircase region is covered with the dielectric film 13.

As illustrated in the examples of FIGS. 18A and 19A, in all Embodiment 2 and Comparative Example, by configuring the stacked body of the conductive layer 10 and the dielectric layer 12 in a staircase shape, each conductive layer 10 is formed as a structure of being easily connected to the contact 16 from the upper layer side. Herein, in Comparative Example illustrated in FIG. 19B, as described in FIG. 2A, the contact 16 is connected to the corresponding conductive layer 10 from the upper side, for example, at the center of each terrace having a staircase shape, and on the lower layer side of each terrace, a total of four support pillars 15 are arranged one by one at, for example, four corners of the terrace away from contact 16. Therefore, there is a possibility that the contact 16 penetrates through the conductive layer 10 to be connected and reaches the conductive layer 10 of the lower layer side, and electrical connection is made with respect to the conductive layer 10 of the lower layer side. Furthermore, a terrace area is required for being capable of arranging all of the four support pillars 15 and the contacts 16 with respect to the terrace of one word line (conductive layer 10). In order to further increase the integration of the three-dimensional NAND flash memory device, it is preferable to reduce the area of the terrace. Therefore, in Embodiment 2 illustrated in FIG. 18B, as described with reference to FIG. 2B, the support pillar 14 made of a dielectric material having a diameter larger than that of the contact 16 is used.

As illustrated in FIG. 18A, the support pillar 14a (an example of the first support pillar) is connected to the lower surface or the side surface of the conductive layer 10a (an example of the first conductive layer) at a position in the staircase region (the first region) not overlapping with the conductive layer 10b (an example of the second conductive layer), and extends to the substrate. The support pillar 14b (an example of the second support pillar) is connected to the lower surface or the side surface of the conductive layer 10b and extends to the substrate so as to penetrate through the conductive layer 10a in the staircase region. The support pillar 14c (another example of the second support pillar) is connected to the lower surface or the side surface of the conductive layer 10c and extends to the substrate so as to penetrate through the conductive layers 10a and 10b in the staircase region.

Herein, in Embodiment 2, the metal films 40 having the same diameter size or substantially the same diameter size are arranged on the respective support pillars 14. In the example of FIG. 18A, the metal film 40a (an example of the first conductor film) is arranged so that a portion thereof is included in the conductive layer 10a at a position in the staircase region and not overlapping with the conductive layer 10b and is connected to the side surface of the conductive layer 10a. The metal film 40b (an example of the second conductor film or another example of the first conductor film) is arranged so that a portion thereof is included in the conductive layer 10b in the staircase region, and is connected to the side surface of the conductive layer 10b. The metal film 40c (another example of the second conductor film) is arranged so that a portion thereof is included in the conductive layer 10c in the staircase region, and is connected to the side surface of the conductive layer 10c. Then, as described above, the support pillar 14a are arranged with substantially the same diameter size as the metal film 40a, is connected to the lower surface of the metal film 40a, and extends to the semiconductor substrate 200. As described above, the support pillar 14b is arranged with substantially the same diameter size as the metal film 40b, is connected to the lower surface of the metal film 40b, and extends to the semiconductor substrate 200 so as to penetrate through the conductive layer 10a. As described above, the support pillar 14c is arranged with substantially the same diameter size as the metal film 40c, is connected to the lower surface of the metal film 40c, and extends to the semiconductor substrate 200 so as to penetrate through the conductive layers 10a and 10b. The film thickness of each metal film 40 is formed to be larger than that of the corresponding conductive layer 10. That is, the film thickness of the metal film 40a is larger than that of the conductive layer 10a. The film thickness of the metal film 40b is larger than that of the conductive layer 10b. The film thickness of the metal film 40c is larger than that of the conductive layer 10c.

Figures 20A, 20B:
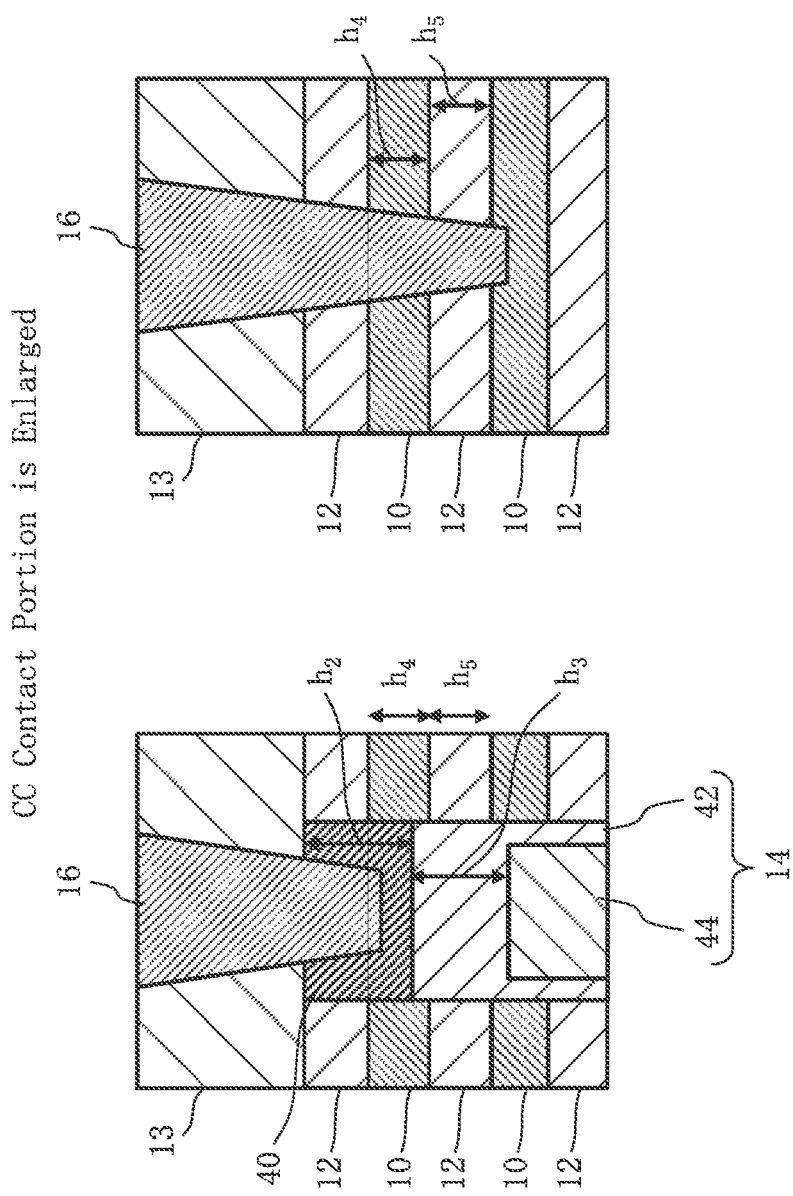
FIGS. 20A and 20B are enlarged cross-sectional views illustrating examples of a connecting portion between a conductive layer and a contact in Embodiment 2 and Comparative Example.

FIGS. 20A and 20B are enlarged cross-sectional views illustrating examples of a connecting portion between a conductive layer and a contact in Embodiment 2 and Comparative Example. In Comparative Example, as illustrated in FIG. 20B, since both of the film thickness h4 of the conductive layer 10 and the film thickness h5 of the dielectric layer 12 are formed to be constant at both of the connecting portion with the contact 16 and the other region portion, in some cases, the contact 16 may penetrate through the conductive layer 10 to be connected, and in the case of penetrating through the conductive layer 10, the distance to the conductive layer 10 of the lower layer side is short. For this reason, there may be a case where the process margin is small, the contact 16 penetrates through the conductive layer 10 to be connected and reaches the conductive layer 10 of the lower layer side, and the electrical connection is made with respect to the conductive layer 10 of the lower layer side.

On the other hand, in Embodiment 2, as illustrated in FIG. 20A, the film thickness h2 of the metal film 40 is formed to be larger than the film thickness h4 of the conductive layer 10. In addition, in the examples of FIGS. 18A and 20A, a case where the film thickness of the metal film 40 becomes large toward the upper side is illustrated. In other words, the upper surface of the metal film 40a is arranged above the upper surface of the conductive layer 10a. The upper surface of the metal film 40a is formed on substantially the same surface as the upper surface of the dielectric layer 12 on the conductive layer 10a. The upper surface of the metal film 40b is arranged above the upper surface of the conductive layer 10b. The upper surface of the metal film 40b is formed on substantially the same surface as the upper surface of the dielectric layer 12 on the conductive layer 10b. The upper surface of the metal film 40c is arranged above the upper surface of the conductive layer 10c. The upper surface of the metal film 40c is formed on substantially the same surface as the upper surface of the dielectric layer 12 on the conductive layer 10c. Each of the contacts 16 is connected to the corresponding metal film 40 with a diameter size smaller than the diameter size of the support pillar 14 at the region position on the inner side in the radial direction of the corresponding support pillar 14 in the staircase region. In the example of FIG. 18A, the contact 16a is electrically connected to the conductive layer 10a by being connected to the metal film 40a with a diameter size smaller than the diameter size of the support pillar 14a at the region position on the inner side in the radial direction of the support pillar 14a. The contact 16b is electrically connected to the conductive layer 10b by being connected to the metal film 40b with a diameter size smaller than the diameter size of the support pillar 14b at the region position on the inner side in the radial direction of the support pillar 14b. The contact 16c is electrically connected to the conductive layer 10c by being connected to the metal film 40c with a diameter size smaller than the diameter size of the support pillar 14c at the region position on the inner side in the radial direction of the support pillar 14c. In this manner, by allowing the film thickness of the metal film 40 to be large, the contact 16 is hard to penetrate through the metal film 40, and a large contact area between the contact 16 and the conductive layer 10 can be allocated, so that a process margin at the time of forming the contact can be increased.

In addition, in Embodiment 2, each of the support pillars 14 is formed in a two-layer structure of an upper film 42 and a support pillar underlying film 44 to be the lower film. The upper film 42 is configured with of a dielectric material having an insulation property higher than that of the support pillar underlying film 44. In addition, the upper film 42 covers the sidewall portion of the support pillar underlying film 44. In addition, the upper film 42 has a film thickness larger than the size in the film thickness direction between the adjacent conductive layers 10 (for example, between the conductive layers 10b and 10c). Specifically, the film thickness h3 of the upper film 42 is formed to be larger than the film thickness h5 of the dielectric layer 12. Therefore, even if each contact 16 penetrates through the corresponding metal film 40, merely by sticking into the upper film 42 in the support pillar 14 of the lower layer side, the contact 16 can be prevented from contacting the conductive layer 10 of the lower layer side. From this point of view, the process margin at the time of contact formation can be increased.

Herein, when the film thickness of the metal film 40 on the uppermost surface of each terrace becomes large, the distance from the conductive layer 10 of the upper layer side of the one layer becomes short. For this reason, there is a possibility that contact with the conductive layer 10 of the upper layer side becomes a problem. In Embodiment 2, as illustrated in FIG. 18A, since the metal film 40 is formed with substantially the same diameter size on the support pillar 14, the dielectric layer 12 forming a pair with the conductive layer 10 including the metal film 40 and constituting the same terrace can be allowed to remain between the metal film 40 and the conductive layer 10 of the upper layer side on the root of the terrace. Furthermore, in Embodiment 2, a spacer film 46 made of a dielectric material is arranged on the end sidewall of each terrace. Therefore, the spacer film 46 made of the dielectric material is arranged on the end sidewall of the conductive layer 10 of the upper layer side. For this reason, the spacer film 46 is interposed between the metal film 40 and the conductive layer 10 of the upper layer side. With this configuration, even when the metal film 40 having a large film thickness is arranged, it is possible to avoid contact with the conductive layer 10 of the upper layer side and to improve the insulation property.

In addition, when the metal film 40 and the conductive layer 10 are configured with, for example, the same material and are regarded as an integrated body as the conductive layer 10, even if each contact 16 penetrates through the conductive layer 10 to be connected, merely by sticking into the upper film 42 in the support pillar 14 of the lower layer side, the contact 16 can be prevented from contacting the conductive layer 10 of the lower layer side. Furthermore, the film thickness of the conductive layer 10 (for example, the conductive layer 10a) at the region position on the inner side in the radial direction of each support pillar 14 (for example, the support pillar 14a) is formed to be larger than the film thickness of the conductive layer 10 (the conductive layer 10a) in the region portion overlapping with the conductive layer 10 (for example, the conductive layer 10b) of a different terrace of the upper layer side in the staircase region. In the example of FIG. 18A, since the film thickness of the metal film 40 is formed to be large, the film thickness of each conductive layer 10 on the support pillar 14 is formed to be larger than the film thickness of the other portions of the conductive layer 10. In other words, the film thickness of the portion of the conductive layer 10a on the support pillar 14a is formed to be larger than the film thickness of the other portion of the conductive layer 10a. Similarly, the film thickness of the portion of the conductive layer 10b on the support pillar 14b is formed to be larger than the film thickness of the other portion of the conductive layer 10b. Similarly, the film thickness of the portion of the conductive layer 10c on the support pillar 14c is formed to be larger than the film thickness of the other portion of the conductive layer 10c. Therefore, each contact 16 is hard to penetrate through the conductive layer 10, and a large contact area between the contact 16 and the conductive layer 10 can be allocated, so that a process margin at the time of forming the contact can be increased.

In addition, in Embodiment 2, as illustrated in FIG. 18B, since only one support pillar 14 is arranged on the terrace of each layer, the terrace area can be allowed to be smaller than that in Comparative Example illustrated in FIG. 19B.

In addition, in Embodiment 2, as illustrated in FIG. 18A, in the memory cell region, a pillar-shaped channel body 21 penetrating through the stacked body of the conductive layers 10 of the plurality of layers and the dielectric layers 12 of the plurality of layers in a stacking direction perpendicular to the stacked surface is arranged. A semiconductor material is used as a material of the channel body 21. In addition, in the memory cell region, a memory film 20 including a charge accumulation film is arranged between each conductive layer 10 and the channel body 21. The memory film 20 is arranged in a cylindrical shape penetrating through the stacked body of the conductive layers 10 of the plurality of layers and the dielectric layers 12 of the plurality of layers in the stacking direction so as to surround the entire side surface of the channel body 21. One memory cell is configured with a combination of the conductive layer 10 serving as a word line, the memory film 20, and the channel body 21 surrounded by the memory film 20. One NAND string is configured with a plurality of memory cells connecting memory cells in the conductive layer 10 of each layer through which the same channel body 21 and memory film 20 penetrate. One end of the channel body 21 is connected to a bit line contact (not illustrated), for example, in a layer upper than the stacked body. The other end of the channel body 21 is connected to a common source line (not illustrated), for example, in a layer lower than the stacked body. In addition, each of the pillar-shaped channel bodies 21 may have a cylindrical-shaped structure having a bottom portion using a semiconductor material and a core portion using a dielectric material arranged in the inside thereof.

Figure 21:
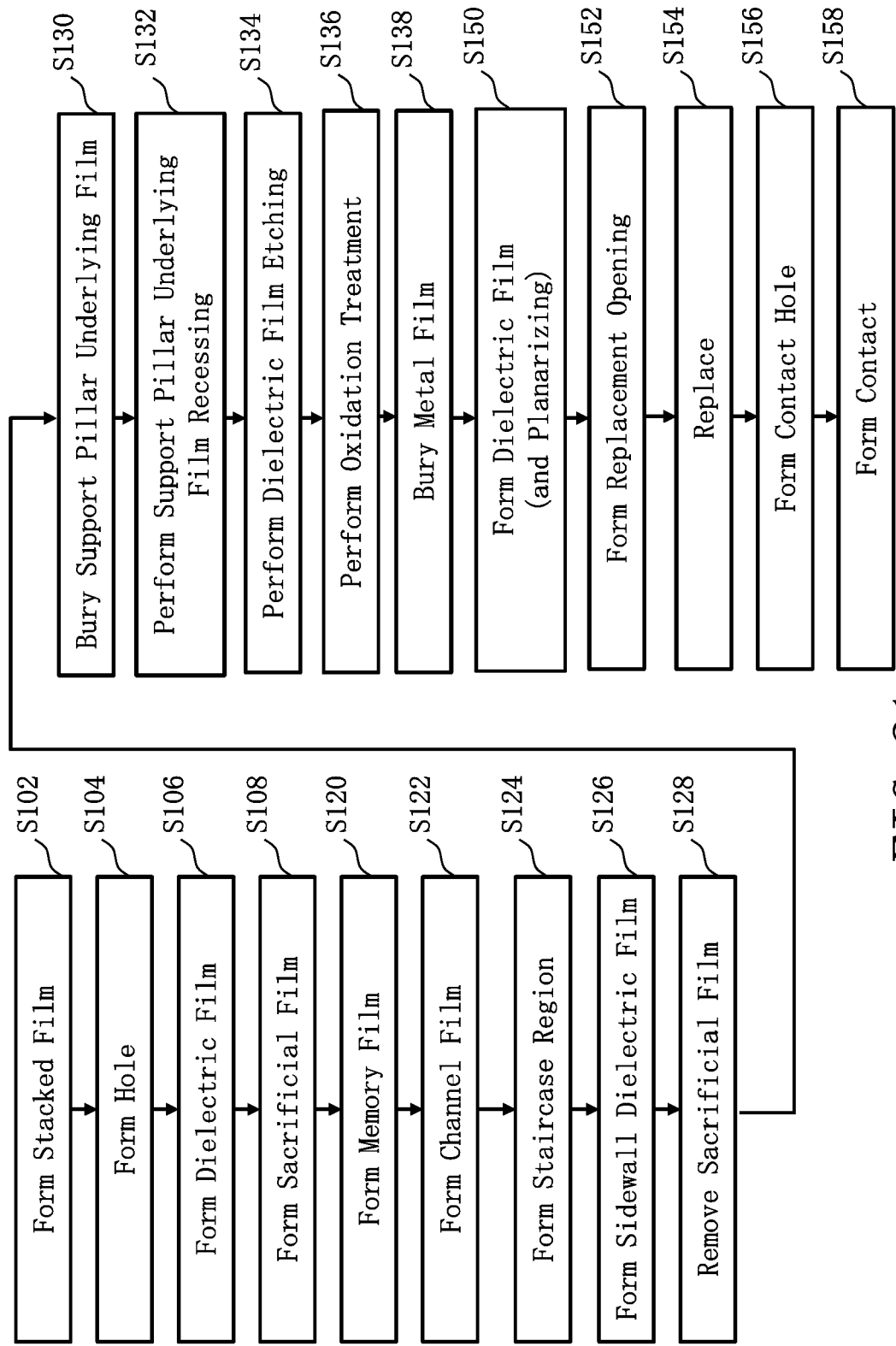
FIG. 21 is a flowchart illustrating main processes of a method of manufacturing the semiconductor device according to Embodiment 2.

FIG. 21 is a flowchart illustrating main processes of a method of manufacturing the semiconductor device according to Embodiment 2. In FIG. 21, in the method of manufacturing a semiconductor device according to Embodiment 2, a series of processes including a stacked film forming process (S102), a hole forming process (S104), a dielectric film forming process (S106), a sacrificial film forming process (S108), a memory film forming process (S120), a channel film forming process (S122), a staircase region forming process (S124), a sidewall dielectric film forming process (S126), a sacrificial film removing process (S128) a support pillar underlying film burying process (S130), a support pillar underlying film recessing process (S132), a dielectric film etching process (S134), an oxidation treatment process (S136), a metal film burying process (S138), a dielectric film forming/planarizing process (S150), a replacement opening forming process (S152), a replacing process (S154), a contact hole forming process (S156), and a contact forming process (S158) performed. Hereinafter, each process will be described while illustrating the staircase region. Since the illustration of the memory cell region is similar to that of Embodiment 1, description thereof will be omitted.

Figure 22A:
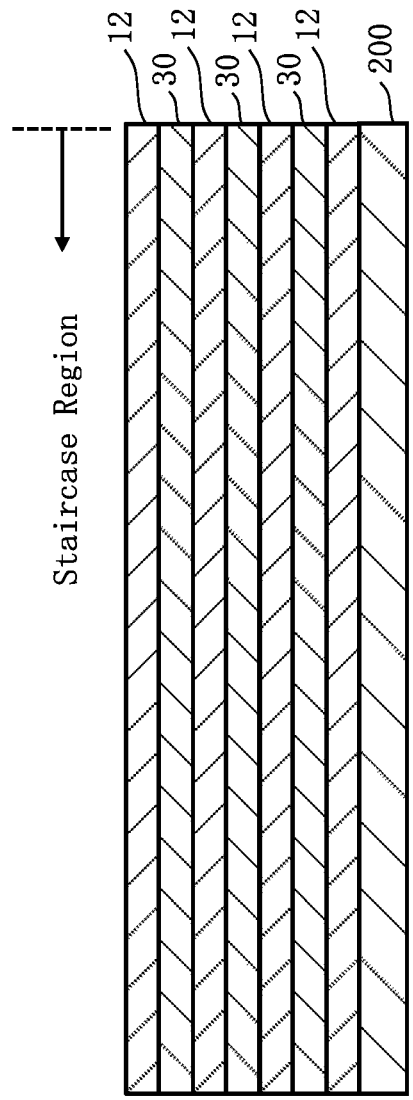
FIGS. 22A to 22C are cross-sectional views illustrating a portion of the processes of the method of manufacturing the semiconductor device according to Embodiment 2.
Figure 22B:
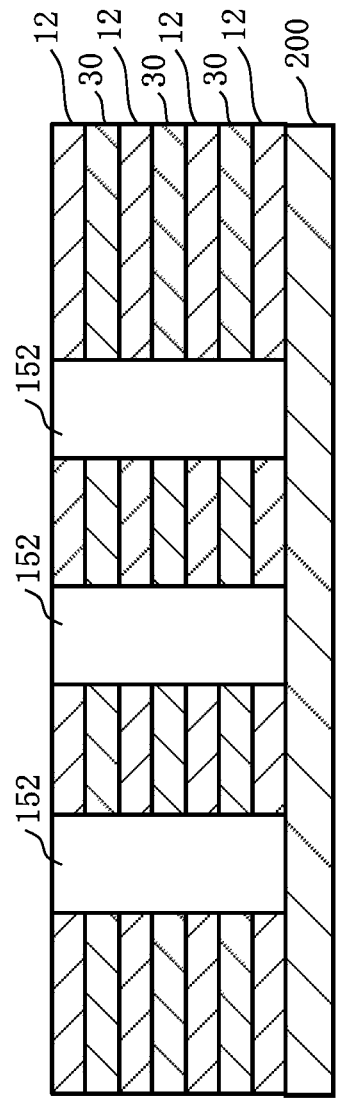
Figure 22C:
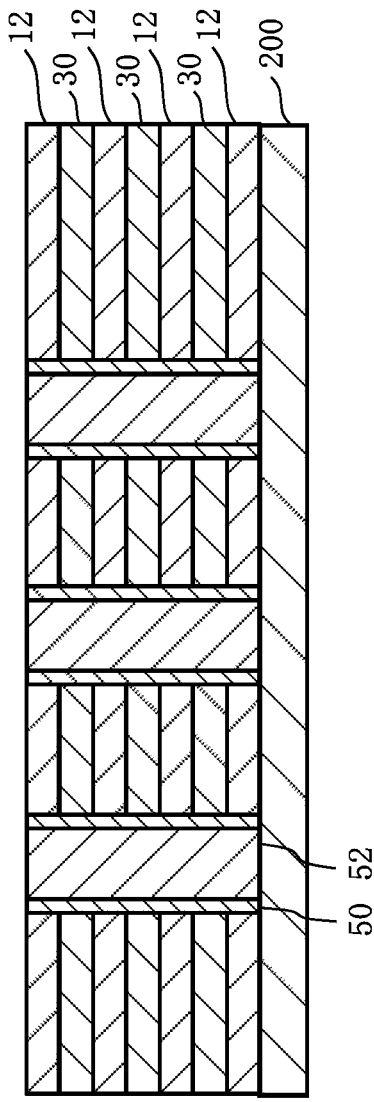

FIGS. 22A to 22C are cross-sectional views illustrating a portion of the processes of the method of manufacturing the semiconductor device according to Embodiment 2. In FIGS. 22A to 22C, the processes from the stacked film forming process (S102) to the sacrificial film forming process (S108) in FIG. 21 are illustrated. The subsequent processes will be described later.

In FIG. 22A, as the stacked film forming process (S102), the sacrificial film layer 30 and the dielectric layer 12 are alternately stacked on the semiconductor substrate 200 by using, for example, an ALD method, an ALCVD method, or a CVD method. The details of the stacked film forming process (S102) are the same as those in Embodiment 1.

In FIG. 22B, as the hole forming process (S104), for example, a circular opening (hole 152) penetrating through the stacked film from an upper portion above the dielectric layer 12 of the uppermost layer of the stacked film of the sacrificial film layer 30 and the dielectric layer 12 is formed in a region to be a staircase region later. The details of the hole forming process (S104) are the same as those in Embodiment 1. In addition, in the memory cell region (not illustrated), similarly to Embodiment 1, it is preferable to simultaneously form a plurality of the memory holes.

In FIG. 22C, as the dielectric film forming process (S106), a dielectric film 50 is formed on the sidewall of the support pillar forming hole 152 by using, for example, an ALD method, an ALCVD method, or a CVD method. For example, a $SiO_2$ film is preferably used as the dielectric film 50.

Next, as the sacrificial film forming process (S108), a sacrificial film 52 is formed (buried) in the hole 152 in which the dielectric film 50 is formed on the sidewall by using, for example, an ALD method, an ALCVD method, or a CVD method. For example, a SiN film is preferably used as the sacrificial film 52.

Next, with respect to the memory cell region (not illustrated), a memory film forming process (S120) and a channel film forming process (S122) are performed. The details of the memory film forming process (S120) and the channel film forming process (S122) are the same as those of Embodiment 1. By such a process, as illustrated in FIG. 7, the memory film 20 and the channel body 21 are formed in a pillar shape along the inner sidewall surface of the memory film 20. As illustrated in FIG. 7, the memory film 20 includes a block dielectric film 28, a charge accumulation film 26, and a tunnel dielectric film 24.

FIGS. 23A to 23C are cross-sectional views illustrating a portion of the processes of the method of manufacturing the semiconductor device according to Embodiment 2. In FIGS. 23A to 23C, the processes from the staircase region forming process (S124) to the sacrificial film removing process (S128) in FIG. 21 are illustrated. The subsequent processes will be described later.

In FIG. 23A, as the staircase region forming process (S124), a staircase shape is formed in the stacked film of the sacrificial film layer 30 and the dielectric layer 12. The details in the staircase region forming process (S124) are the same as those of Embodiment 1. In the example of FIG. 23A, a case where a staircase shape is formed in a terrace in which a set of the sacrificial film layer 30 and the dielectric layer 12 is configured as, for example, one layer is illustrated.

Herein, similarly to Embodiment 1, in the case of forming each terrace having a staircase shape, it is preferable that, out of the sacrificial film layer 30 and the dielectric layer 12, the dielectric layer 12 is formed so as to be the exposed surface. Therefore, the film quality of the sacrificial film of the sacrificial film layer 30 can be prevented from being damaged by lithography processing or the like. As a result, incomplete replacement in the later-described replacing process (S154) can be suppressed.

In FIG. 23B, as the sidewall dielectric film forming process (S126), the spacer film 46 is formed on the end sidewall of the terrace having a staircase shape. For example, a $SiO_2$ film is preferably used as the spacer film 46. For example, by using an ALD method, an ALCVD method, or a CVD method, for example, a $SiO_2$ film is formed along the staircase shape in the staircase region, and by performing etched back, a remaining $SiO_2$ film is removed to form a spacer film 46 while the end sidewalls of the terrace having a staircase shape is allowed to remain. Specifically, etch back may be performed until the upper surface of the sacrificial film 52 is exposed.

In FIG. 23C, as the sacrificial film removing process (S128), specifically, the sacrificial film 52 in the hole 152 is removed by etching by a wet etching method (for example, hot phosphoric acid treatment), and the inside of the hole 152 is opened. Since the dielectric film 50 is arranged between the sacrificial film 52 and the sacrificial film layer 30, the sacrificial film layer 30 in the stacked film is not exposed, and the sacrificial film 52 in the hole 152 can be removed without removing the sacrificial film layer 30.

Figure 24A:
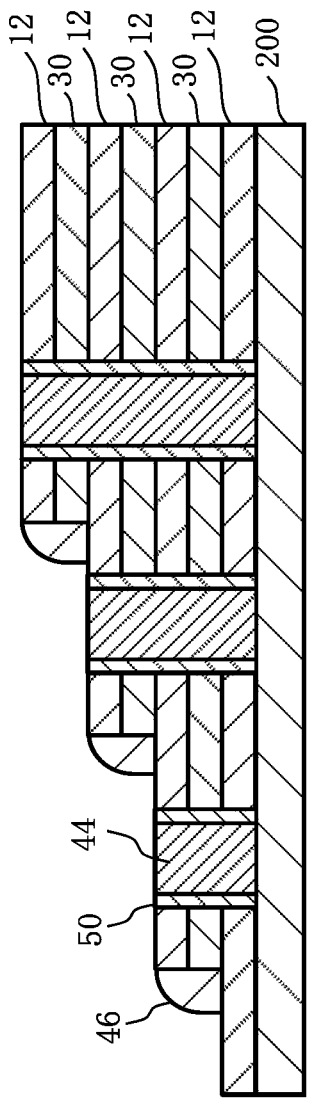
FIGS. 24A to 24C are cross-sectional views illustrating a portion of the processes of the method of manufacturing the semiconductor device according to Embodiment 2.
Figure 24B:
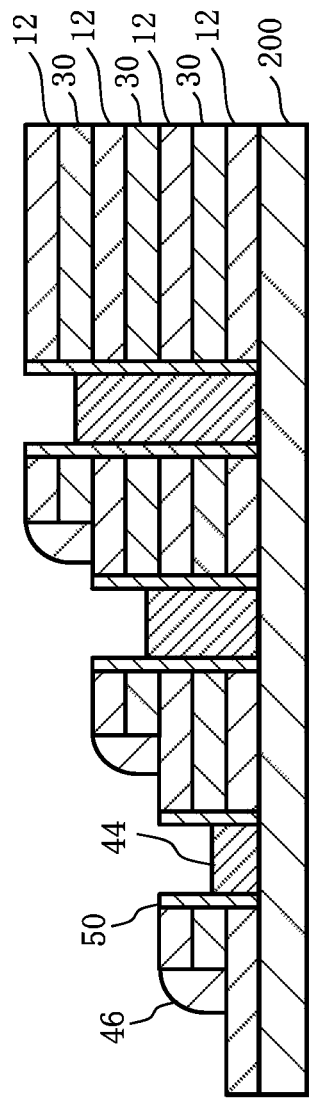
Figure 24C:
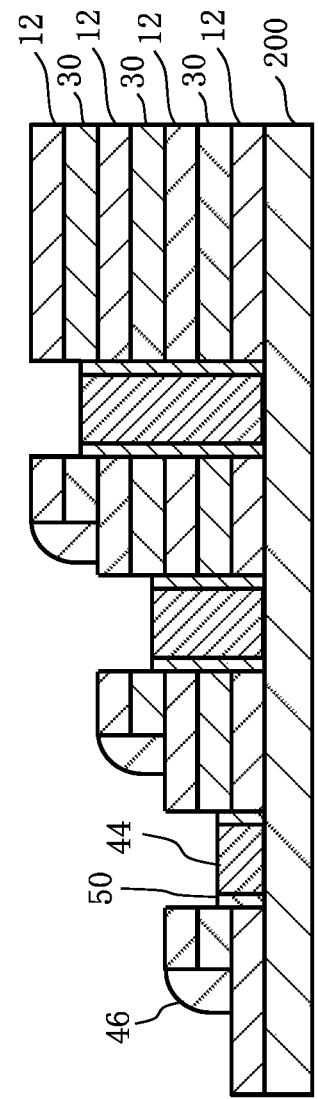

FIGS. 24A to 24C are cross-sectional views illustrating a portion of the processes of the method of manufacturing the semiconductor device according to Embodiment 2. In FIGS. 24A to 24C, the processes from the support pillar underlying film burying process (S130) to the dielectric film etching process (S134) in FIG. 21 are illustrated. The subsequent processes will be described later.

In FIG. 24A, as the support pillar underlying film burying process (S130), the support pillar underlying film 44 is buried in the hole 152 in which the dielectric film 50 is arranged on the sidewall by using, for example, an ALD method, an ALCVD method, or a CVD method. For example, an amorphous silicon (α-Si) film or a polysilicon (p-Si) film is preferably used as the support pillar underlying film 44. The extra film formed outside the hole 152 may be removed by etch-back.

In FIG. 24B, as the support pillar underlying film recessing process (S132), a recess shape is formed by removing a portion of the support pillar underlying film 44 in the hole 152, for example, by a wet etching method (for example, hydrofluoric acid treatment). Herein, among the set of the dielectric layer 12 and the sacrificial film layer 30 constituting the terrace for one layer of the staircase shape, the height position of the surface of the support pillar underlying film 44 is recessed to the height position lower than the upper surface of the sacrificial film layer 30 and higher than the lower surface of the sacrificial film layer 30.

In FIG. 24C, as the dielectric film etching process (S134), the height position of the surface of the dielectric film 50 is aligned with the height position of the surface of the support pillar underlying film 44 by etching the dielectric film 50 by the RIE method.

FIGS. 25A to 25C are cross-sectional views illustrating a portion of the processes of the method of manufacturing the semiconductor device according to Embodiment 2. In FIGS. 25A to 25C, the processes from the oxidation process (S136) in FIG. 21 to the dielectric film forming/planarizing process (S150) are illustrated. The subsequent processes will be described later.

In FIG. 25A, as the oxidation treatment process (S136), the upper portion of the support pillar underlying film 44 is oxidized by thermal oxidation treatment. By such thermal oxidation treatment, the upper film 42 is formed with the $SiO_2$ film having an insulation property higher than that of the material of the support pillar underlying film 44. The upper film 42 is integrated with the dielectric film 50 on the sidewall of the support pillar underlying film 44 which remains without being oxidized to form the dielectric layer on the upper portion and the sidewall of the support pillar underlying film 44. By appropriately controlling the temperature and time of the thermal oxidation treatment, the upper film 42 having a desired film thickness can be formed. Herein, the upper film 42 is formed so as to have a film thickness larger than that of the dielectric layer 12. By such a process, the support pillar 14 having a two-layer structure of the upper film 42 and the support pillar underlying film 44 can be formed.

FIG. 25B, as the metal film burying process (S138), the metal film 40 is formed on the upper film 42 in the hole 152 by using, for example, an ALD method, an ALCVD method, or a CVD method, so that the inside of the hole 152 is buried with the metal film 40. For example, a W film is preferably used as the metal film 40. By such a process, the metal film 40 having the same diameter as that of the support pillar 14 can be formed on the support pillar 14. The excess film formed outside the hole 152 may be removed by etching. By such a process, the metal film 40 having a film thickness larger than the film thickness of the sacrificial film layer 30 which is to be replaced with the conductive layer 10 later can be formed. The height position of the surface of the metal film 40 formed on each terrace in the staircase region is the same position as the surface of the dielectric layer 12.

In FIG. 25C, as the dielectric film forming/planarizing process (S150), the dielectric film 13 is formed in the staircase region and the memory cell region by using, for example, an ALD method, an ALCVD method, or a CVD method, and after that, planarizing is performed. The details of the dielectric film forming/planarizing process (S150) are the same as those of Embodiment 1.

Figure 26A:
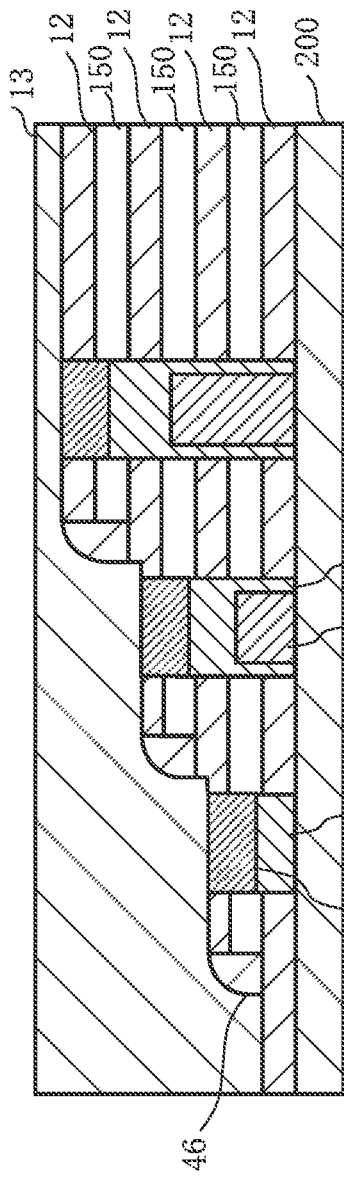
FIGS. 26A to 26C are cross-sectional views illustrating a portion of the processes of the method of manufacturing the semiconductor device according to Embodiment 2.
Figure 26B:
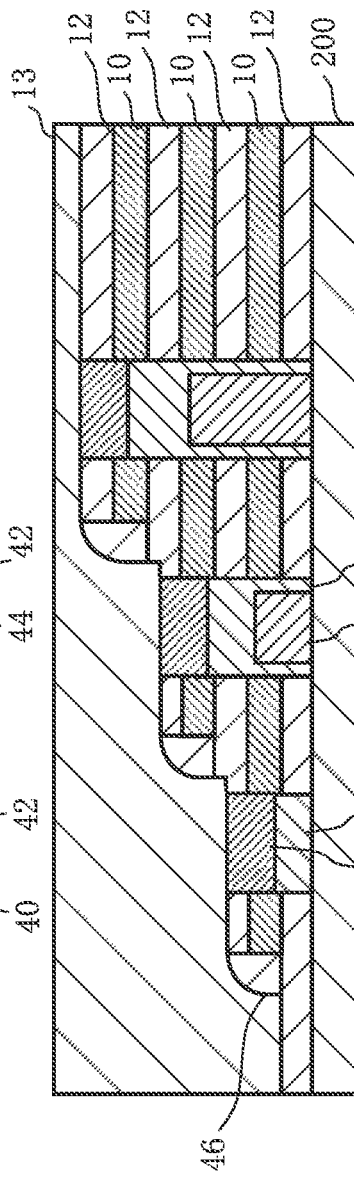
Figure 26C:
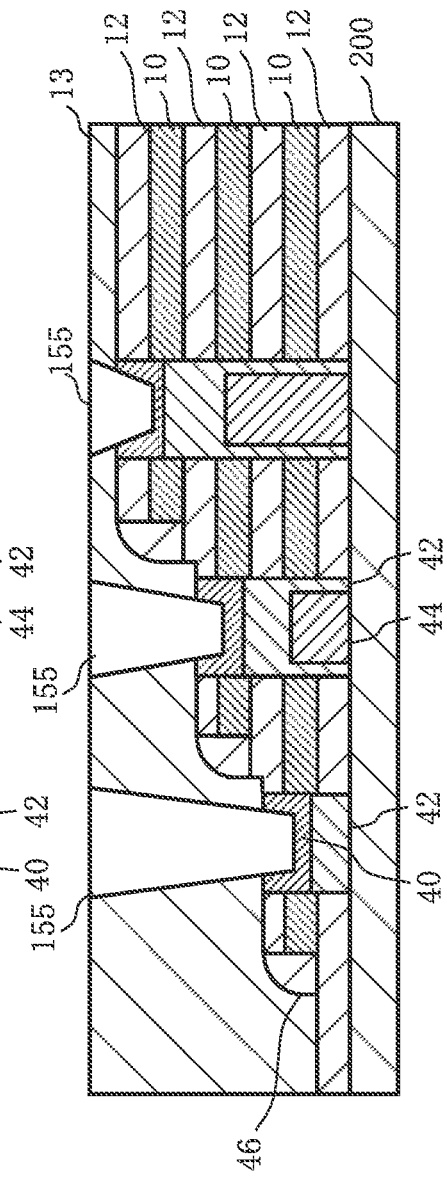

FIGS. 26A to 26C are cross-sectional views illustrating a portion of the processes of the method of manufacturing the semiconductor device according to Embodiment 2. In FIGS. 26A to 26C, the processes from the replacement opening forming process (S152) to the contact hole forming process (S156) in FIG. 21 are illustrated. The subsequent processes will be described later.

In FIG. 26A, first, the replacement opening forming process (S152) is performed to form the groove 151 similarly to FIG. 14. The details of the replacement opening forming process (S152) are the same as those of Embodiment 1.

Next, as a portion of the replacing process (S154), the sacrificial film layer 30 of each layer is removed by etching through the replacement groove 151 by a wet etching method (for example, hot phosphoric acid treatment). By such a process, a space 150 is formed in the sacrificial film layer 30 by allowing the metal film 40 to remain. In the staircase region, the support pillar 14 extending in a direction perpendicular to the dielectric layer 12 of each layer and the metal film 40 on the support pillar 14 serve as a support member (pillar), so that the dielectric layer 12 of each layer can be supported so as not to collapse. In the memory cell region, the memory film 20 and the channel body 21 extending in a direction perpendicular to the dielectric layer 12 of each layer serve as support members (pillars), so that the dielectric layer 12 of each layer can be supported so as not to collapse.

In FIG. 26B, as the remaining portion of the replacing process (S154), the barrier metal film 11 illustrated in FIG. 7 is first formed on the upper and lower wall surfaces and the sidewall of the space 150 between the dielectric layers 12 of each layer through the replacement groove 151 by using an ALD method, an ALCVD method, or an CVD method. After that, the conductive layer 10 is formed by burying a conductive material serving as a word line in the space 150 between the dielectric layers 12 of each layer by using an ALD method, an ALCVD method, or a CVD method. The details of the replacing process (S154) are the same as those in Embodiment 1.

By such a process, as illustrated in FIG. 7, when, for example, Al$_2$O$_3$ is used as the material of the block dielectric film 28, it is possible to form a memory cell having a MANOS structure with metal (M)-aluminum oxide (A)-nitride film (N)-oxide film (O)-silicon (S).

Alternatively, when a SiO$_2$ film is used as the block dielectric film 28, it is possible to form a memory cell having a MONOS structure with metal (M)-oxide film (O)-nitride film (N)-oxide film (O)-silicon (S).

In FIG. 26C, as the contact hole forming process (S156), the contact hole 155 extending from an upper portion above the dielectric film 13 and reaching each metal film 40 located on each terrace in the staircase region is formed in the staircase region by using a lithography technique and an RIE method. Each contact hole 155 is opened so as to be located in the region on the inner side in the radial direction of the support pillar 14 below the corresponding metal film 40. In other words, each contact hole 155 is opened at a position not deviated from the region on the inner side in the radial direction of the support pillar 14 below the corresponding metal film 40. In addition, each contact hole 155 is formed with a size smaller than the diameter size of the support pillar 14 at the height position of the upper surface or the lower surface of the metal film 40.

Then, as the contact forming process (S158), a conductive material is buried in the contact hole 155. For example, W is buried. Therefore, as illustrated in FIG. 18A, each contact 16 having a size smaller than that of the support pillar 14 is connected to the conductive layer 10 with interposing the metal film 40 at the region position on the inner side in the radial direction of the corresponding support pillar 14.

Besides, in the memory cell area, a bit line contact (not illustrated) and the like are connected to each channel body 21. Thus, the semiconductor device illustrated in FIG. 18A can be formed.

Figure 27:
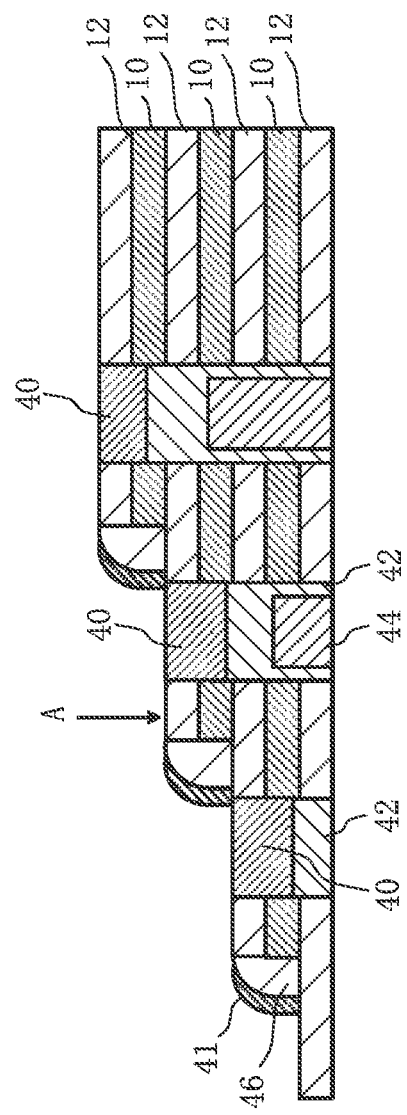
FIG. 27 is a view for describing an effect of the semiconductor device according to Embodiment 2.

FIG. 27 is a view for describing an effect of the semiconductor device according to Embodiment 2. In the metal film burying process (S138), as illustrated in FIG. 27, even when, for example, an excess metal film 41 formed outside the hole 152 is not completely removed, if the dielectric layer 12 at the end portion (A portion) rather than the metal film 40 in each terrace is exposed it is possible to avoid connection between the conductive layers 10 of adjacent layers.

Figure 28:
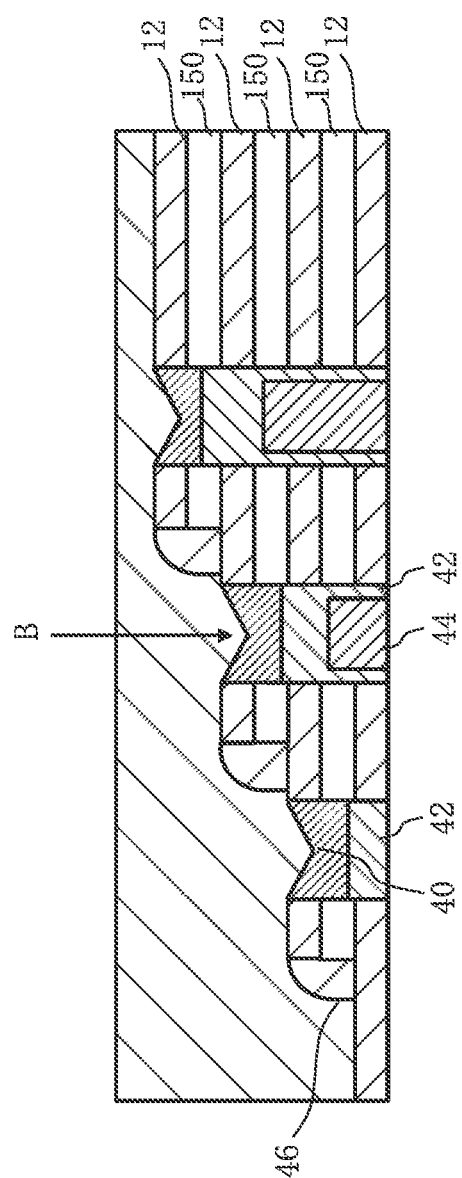
FIG. 28 is a view for describing other effects of the semiconductor device according to Embodiment 2.

FIG. 28 is a view for describing other effects of the semiconductor device according to Embodiment 2. In a portion of the replacing process (S154), as illustrated in FIG. 28, for example, in a case (B portion) where the surface of the metal film 40 is not formed up to the same height position as the surface of the dielectric layer 12 of the same terrace but is slightly scraped off, even if the metal film 40 is arranged up to the upper height position of the space 150 having the sacrificial film layer 30 of the stacked film, the metal film 40 can function as a pillar supporting the dielectric layer 12.

As described above, according to Embodiment 2, since the support pillar 14 made of a dielectric material having a size larger than that of the contact 16 is arranged on the lower layer side at the forming position of each contact 16, even when the contact 16 penetrates through metal film 40, it is possible to prevent contact with the conductive layer 10 of the lower layer side. In addition, since the film thickness of the metal film 40 located in each terrace in the staircase region becomes large, it is difficult for each contact 16 to penetrate through the metal film 40, so that it is possible to increase the process margin. Furthermore, since the diameter size of the metal film 40 is formed to be substantially the same as the diameter size of the support pillar 14, a distance can be allocated between the metal film 40 and the other conductive layer 10, so that it is possible to prevent a short circuit between the conductive layers 10. Furthermore, since the upper film 42 and the spacer film 46 having a high insulation property are arranged between the metal film 40 and the other conductive layer 10, it is possible to increase the withstand voltage between the conductive layers 10. In this manner, according to Embodiment 2, it is possible to avoid connection to the conductive layer 10 of the lower layer side in the contact connection of the word line of the three-dimensional NAND type flash memory device.

Embodiment 3

FIGS. 29A and 29B are views illustrating an example of the cross-sectional configuration of the semiconductor device according to Embodiment 3 and an example of arrangement configuration of contacts and support pillars in a staircase region. In FIG. 29A, in the semiconductor device according to Embodiment 3, a conductive layer 10 of each layer among the conductive layers 10 of a plurality of layers serving as word lines (WL) in a semiconductor storage device and a dielectric layer 12 of each layer among the dielectric layers 12 of a plurality of layers insulating the conductive layers 10 of adjacent layers are alternately stacked above a semiconductor substrate 200 (substrate). Then, similarly to Embodiment 1, the conductive layer 10 of each layer is formed in a plate shape and extending in parallel with the surface of the semiconductor substrate 200 so as to spread over the staircase region (word line contact region) (first region) and the memory cell region (second region). In the example of FIG. 29A, a dielectric layer 12 is arranged above the semiconductor substrate 200 first, and a conductive layer 10 is arranged on the uppermost layer. In addition, embodiments are not limited to this example, and the dielectric layer 12 may be arranged on the uppermost layer. In FIG. 29A, the stacked body of the conductive layers 10 of the plurality of layers and the dielectric layers 12 of the plurality of layers is formed so as to have a staircase shape in which the lower layer side protrudes in a staircase region. In the example of FIG. 29A, a staircase shape is formed by terraces each which is configured with, for example, one set layer being a set of the conductive layer 10 and the dielectric layer 12. In addition, the number of layers of set layer being the set of the conductive layer 10 and the dielectric layer 12 constituting each terrace is not limited to one layer. The number of layers of set layers may be two or more layers. In the example of FIG. 29A, for example, the plate-shaped conductive layer 10a (an example of the first conductive layer) of the first layer is provided above the semiconductor substrate 200 and extends in parallel with the surface of the semiconductor substrate 200 so as to spread over the staircase region and the memory cell region. Then, the plate-shaped conductive layer 10b (an example of the second conductive layer) of the second layer is arranged to be separated at a distance above the conductive layer 10a so as to have a staircase shape in which that the end portion of the conductive layer 10a protrudes, and extends in parallel with the conductive layer 10a so as to spread over the staircase region and the memory cell region. Then, the plate-shaped conductive layer 10c of the third layer is arranged to be separated at a distance above the conductive layer 10b so as to have a staircase shape in which the end portion of the conductive layer 10b protrudes, and extends in parallel with the conductive layer 10b so as to spread over the staircase region and the memory cell region. Each terrace in the staircase region is covered with the dielectric film 13.

As illustrated in the example of FIG. 29A, in Embodiment 3, by configuring the stacked body of the conductive layer 10 and the dielectric layer 12 in a staircase shape, each conductive layer 10 is formed as a structure of being easily connected to the contact 16 from the upper layer side. Herein, as described in the example of FIGS. 2A and 19B, there is a possibility that, when the support pillar 15 and the contact 16 are formed at positions away from each other, the contact 16 penetrates through the conductive layer 10 to be connected and reaches the conductive layer 10 of the lower layer side, and electrical connection is made with respect to the conductive layer 10 of the lower layer side. Furthermore, as described in the example of FIGS. 2A and 19B, a terrace area is required for being capable of arranging all of the four support pillars 15 and the contact 16 with respect to the terrace of one word line (conductive layer 10). In order to further increase the integration of the three-dimensional NAND flash memory device, it is preferable to reduce the area of the terrace. Therefore, in Embodiment 3 illustrated in FIG. 29B, as described with reference to FIG. 2B, the support pillar 14 made of a dielectric material having a larger diameter size than the contact 16 is used.

As illustrated in FIG. 29A, the support pillar 14a (an example of the first support pillar) is connected to the lower surface of the conductive layer 10a (an example of the first conductive layer) at a position in the staircase region (the first region) not overlapping with the conductive layer 10b (an example of the second conductive layer), and extends to the substrate. The support pillar 14b (an example of the second support pillar) is connected to the lower surface of the conductive layer 10b and extends to the substrate so as to penetrate through the conductive layer 10a in the staircase region. The support pillar 14c (another example of the second support pillar) is connected to the lower surface of the conductive layer 10c and extends to the substrate so as to penetrate through the conductive layers 10a and 10b in the staircase region.

Herein, in Embodiment 3, the metal films 40 having the same diameter size or substantially the same diameter size are arranged on the respective support pillars 14. In the example of FIG. 29A, the metal film 40a (an example of the first conductor film) is arranged so that a portion thereof is included in the conductive layer 10a at a position in the staircase region and not overlapping with the conductive layer 10b and is connected to the side surface of the conductive layer 10a. In the example of FIG. 29A, the metal film 40a and the conductive layer 10a are integrally formed. The metal film 40b (an example of the second conductor film or another example of the first conductor film) is arranged so that a portion thereof is included in the conductive layer 10b in the staircase region, and is connected to the side surface of the conductive layer 10b. In the example of FIG. 29A, the metal film 40b and the conductive layer 10b are integrally formed. The metal film 40c (another example of the second conductor film) is arranged so that a portion thereof is included in the conductive layer 10c in the staircase region, and is connected to the side surface of the conductive layer 10c. In the example of FIG. 29A, the metal film 40c and the conductive layer 10c are integrally formed. Then, as described above, the support pillar 14a are arranged with substantially the same diameter size as the metal film 40a, and is connected to the lower surface of the metal film 40a and extends toward the semiconductor substrate 200. As described above, the support pillar 14b is arranged with substantially the same diameter size as the metal film 40b, and is connected to the lower surface of the metal film 40b and extends toward the semiconductor substrate 200 so as to penetrate through the conductive layer 10a. As described above, the support pillar 14c is arranged with substantially the same diameter size as the metal film 40c, and is connected to the lower surface of the metal film 40c and extends toward the semiconductor substrate 200 so as to penetrate through the conductive layers 10a and 10b. The film thickness of each metal film 40 is formed to be larger than that of the corresponding conductive layer 10. That is, the film thickness of the metal film 40*a* is larger than that of the conductive layer 10*a*. The film thickness of the metal film 40*b* is larger than that of the conductive layer 10*b*. The film thickness of the metal film 40*c* is larger than that of the conductive layer 10*c*.

In addition, in the example of FIG. 29A, a case where the film thickness of the metal film 40 becomes large toward the lower side is illustrated. In other words, the lower surface of the metal film 40*a* is arranged below the lower surface of the conductive layer 10*a*. The upper surface of the metal film 40*a* is formed on substantially the same surface as the upper surface of the conductive layer 10*a*. The lower surface of the metal film 40*b* is arranged below the lower surface of the conductive layer 10*b*. The upper surface of the metal film 40*b* is formed on substantially the same surface as the upper surface of the conductive layer 10*b*. The lower surface of the metal film 40*c* is arranged below the lower surface of the conductive layer 10*c*. The upper surface of the metal film 40*c* is formed on substantially the same surface as the upper surface of the conductive layer 10*c*. Then, each contact 16 is connected to the corresponding metal film 40 (or the conductive layer 10 integrated with the metal film 40) with a diameter size smaller than the diameter size of the support pillar 14 at the region position on the inner side in the radial direction of the corresponding support pillar 14 in the staircase region. In the example of FIG. 29A, the contact 16*a* is connected to the conductive layer 10*a* by being connected to the metal film 40*a* (or the conductive layer 10*a* integrated with the metal film 40*a*) with a diameter size smaller than the diameter size of the support pillar 14*a* at the region position on the inner side in the radial direction of the support pillar 14*a*. The contact 16*b* is connected to the conductive layer 10*b* by being connected to the metal film 40*b* (or the conductive layer 10*b* integrated with the metal film 40*b*) with a diameter size smaller than the diameter size of the support pillar 14*b* at the region position on the inner side in the radial direction of the support pillar 14*b*. The contact 16*c* is connected to the conductive layer 10*c* by being connected to the metal film 40*c* (or the conductive layer 10*c* integrated with the metal film 40*c*) with a diameter size smaller than the diameter size of the support pillar 14*c* at the region position on the inner side in the radial direction of the support pillar 14*c*. In this manner, by allowing the film thickness of the metal film 40 to be large, the contact 16 is hard to penetrate through the metal film 40, and a large contact area between the contact 16 and the conductive layer 10 can be allocated, so that the process margin at the time of forming the contact can be increased.

Herein, when the film thickness of the metal film 40 of each terrace becomes large, there is a possibility that contact with the conductive layer 10 of the lower layer side of one layer becomes a problem. In Embodiment 3, as illustrated in FIG. 29A, the height position of the lower surface of the metal film 40 is formed to be a position of the upper side above the upper surface of the conductive layer 10 of the lower layer side of one layer in the lower side below the lower surface of the conductive layer 10 of the same layer. In other words, the metal film 40 is formed at the height position up to the middle of the dielectric layer 12 between the layers. Therefore, it is possible to avoid contact with the conductive layer 10 of the lower layer side.

In addition, as illustrated in FIG. 29A, when the metal film 40 and the conductive layer 10 are configured with, for example, the same material and are regarded as an integrated body as the conductive layer 10, even if each contact 16 penetrates through the conductive layer 10 to be connected, merely by sticking into the support pillar 14 of the lower layer side, the contact 16 can be prevented from contacting the conductive layer 10 of the lower layer side. Furthermore, the film thickness of the conductive layer 10 (for example, the conductive layer 10*a*) at the region position on the inner side in the radial direction of each support pillar 14 (for example, the support pillar 14*a*) is formed to be larger than the film thickness of the conductive layer 10 (for example, the conductive layer 10*a*) in the region portion overlapping with the conductive layer 10 (for example, the conductive layer 10*b*) of a different terrace of the upper layer side in the staircase region. In the example of FIG. 29A, since the film thickness of the metal film 40 is formed to be large, the film thickness of each conductive layer 10 on the support pillar 14 is formed to be larger than the film thickness of the other portions of the conductive layer 10. In other words, the film thickness of the portion of the conductive layer 10*a* on the support pillar 14*a* is formed to be larger than the film thickness of the other portion of the conductive layer 10*a*. Similarly, the film thickness of the portion of the conductive layer 10*b* on the support pillar 14*b* is formed to be larger than the film thickness of the other portion of the conductive layer 10*b*. Similarly, the film thickness of the portion of the conductive layer 10*c* on the support pillar 14*c* is formed to be larger than the film thickness of the other portion of the conductive layer 10*c*. Therefore, each contact 16 is hard to penetrate through the conductive layer 10, and a large contact area between the contact 16 and the conductive layer 10 can be allocated, so that a process margin at the time of forming the contact can be increased.

In addition, in Embodiment 3, as illustrated in FIG. 29B, since only one support pillar 14 is arranged on the terrace of each layer, the terrace area can be allowed to be smaller than that in Comparative Example illustrated in FIG. 2A.

In addition, in Embodiment 3, since the conformal etching is performed as described later, the corners of the end portions of the each conductive layer 10 protruding so as to have a staircase shape are rounded (in an R shape).

In addition, in Embodiment 3, similarly to Embodiment 2, as illustrated in FIG. 29A, in the memory cell region, a pillar-shaped channel body 21 penetrating through the stacked body of the conductive layers 10 of the plurality of layers and the dielectric layers 12 of the plurality of layers in a stacking direction perpendicular to the stacked surface is arranged. A semiconductor material is used as a material of the channel body 21. In addition, in the memory cell region, a memory film 20 including a charge accumulation film is arranged between each conductive layer 10 and the channel body 21. The memory film 20 is arranged in a cylindrical shape penetrating through the stacked body of the conductive layers 10 of the plurality of layers and the dielectric layers 12 of the plurality of layers in the stacking direction so as to surround the entire side surface of the channel body 21. One memory cell is configured with a combination of the conductive layer 10 serving as a word line, the memory film 20, and the channel body 21 surrounded by the memory film 20. One NAND string is configured with a plurality of memory cells connecting memory cells in the conductive layer 10 of each layer through which the same channel body 21 and memory film 20 penetrate. One end of the channel body 21 is connected to a bit line contact (not illustrated), for example, in a layer upper than the stacked body. The other end of the channel body 21 is connected to a common source line (not illustrated), for example, in a layer lower than the stacked body. In addition, each of the pillar-shaped channel bodies 21 may have a cylindrical-shaped structure having a bottom portion using a semiconductor material and a core portion using a dielectric material arranged in the inside thereof.

Figure 30:
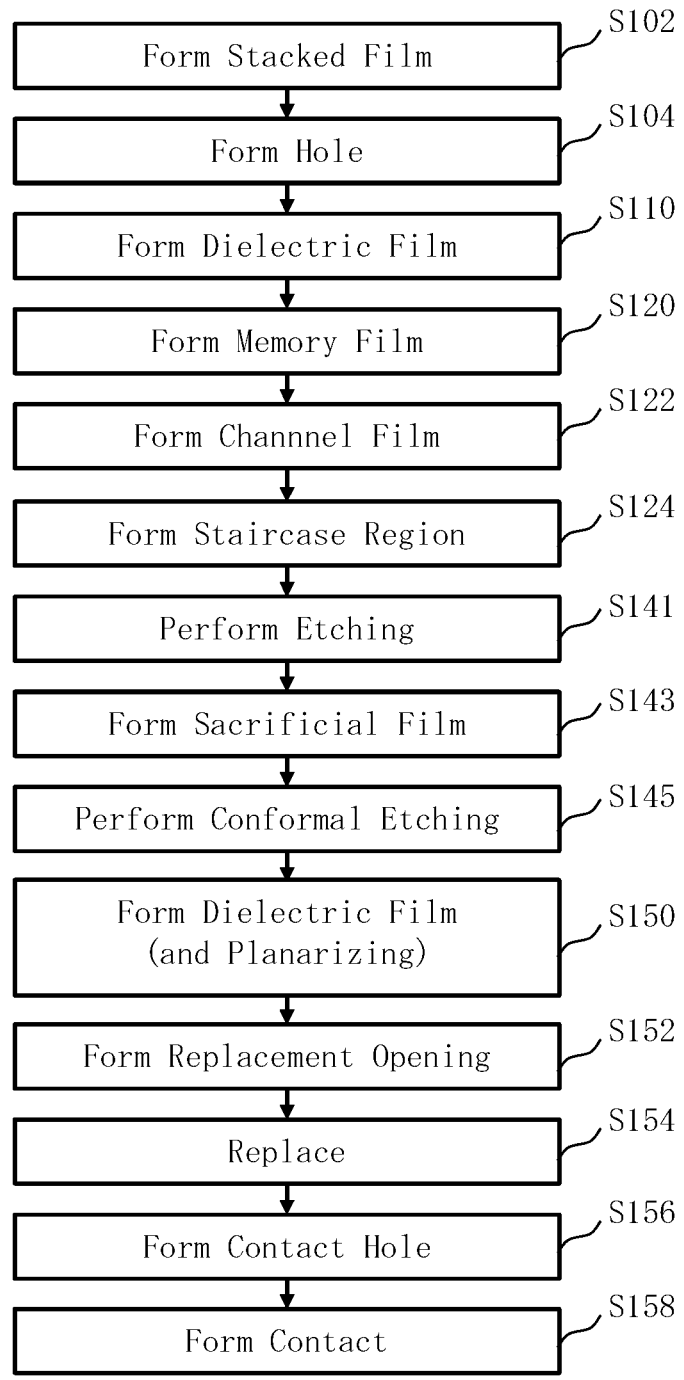
FIG. 30 is a flowchart illustrating main processes of a method of manufacturing the semiconductor device according to Embodiment 3.

FIG. 30 is a flowchart illustrating main processes of a method of manufacturing the semiconductor device according to Embodiment 3. In FIG. 30, in the method for manufacturing a semiconductor device according to Embodiment 3, a series of processes including a stacked film forming process (S102), a hole forming process (S104), a dielectric film forming process (S110), a memory film forming process (S120), a channel film forming process (S122), a staircase region forming process (S124), an etching process (S141), a sacrificial film forming process (S143), a conformal etching process (S145), a dielectric film forming/planarizing process (S150), a replacement opening forming process (S152), a replacing process (S154), a contact hole forming process (S156), and a contact forming process (S158) is performed. Hereinafter, each process will be described while illustrating the staircase region. Since the illustration of the memory cell region is similar to that of Embodiment 1, description thereof will be omitted.

Figure 31A:
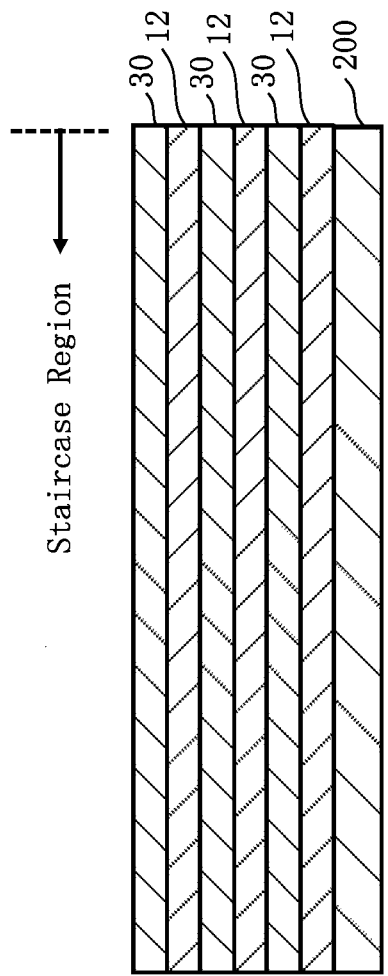
FIGS. 31A to 31C are cross-sectional views illustrating a portion of the processes of the method of manufacturing the semiconductor device according to Embodiment 3.
Figure 31B:
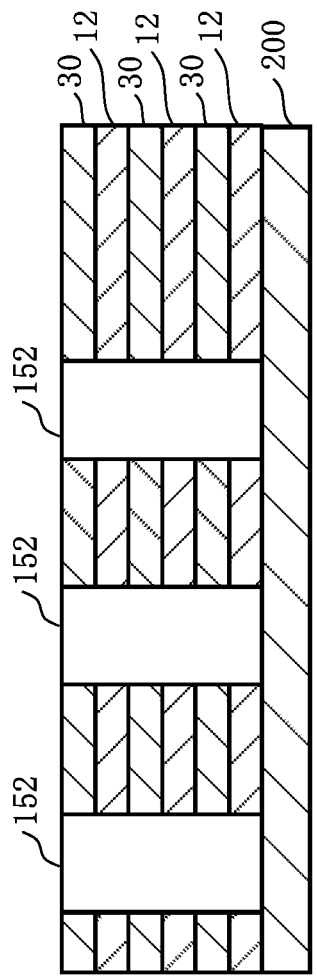
Figure 31C:
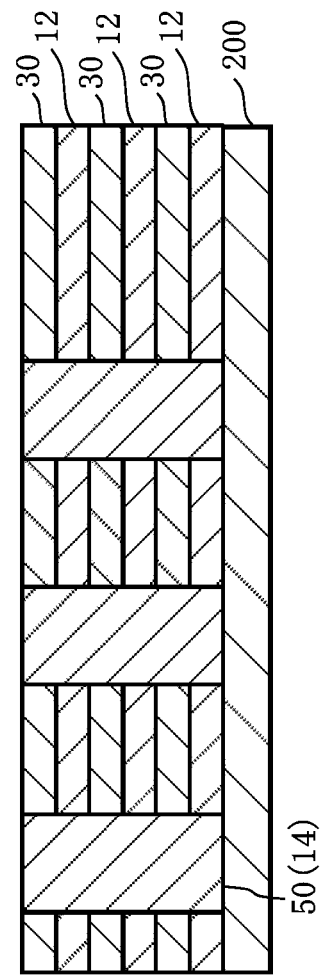

FIGS. 31A to 31C are cross-sectional views illustrating a portion of the processes of the method of manufacturing the semiconductor device according to Embodiment 3. In FIGS. 31A to 31C, the processes from the stacked film forming process (S102) to the dielectric film forming process (S110) in FIG. 30 are illustrated. The subsequent processes will be described later.

In FIG. 31A, as the stacked film forming process (S102), the sacrificial film layer 30 and the dielectric layer 12 are alternately stacked on the semiconductor substrate 200 by using, for example, an ALD method, an ALCVD method, or a CVD method. The details of the stacked film forming process (S102) are the same as those in Embodiment 1. In Embodiment 1, a case where the dielectric layer 12 is formed on the uppermost layer is illustrated, whereas in the example of FIG. 31A, a case where the sacrificial film layer 30 is formed on the uppermost layer is illustrated. In addition, in some cases, the dielectric layer 12 may be formed in the uppermost layer.

In FIG. 31B, as the hole forming process (S104), for example, a circular opening (hole 152) penetrating through the stacked film from an upper portion above the sacrificial film layer 30 of the uppermost layer of the stacked film of the sacrificial film layer 30 and the dielectric layer 12 is formed in a region to be a staircase region later. The details of the hole forming process (S104) are the same as those in Embodiment 1, except that the sacrificial film layer 30 is formed on the uppermost layer. In addition, in the memory cell region (not illustrated), similarly to Embodiment 1, it is preferable to simultaneously form a plurality of the memory holes.

In FIG. 31C, as the dielectric film forming process (S110), the dielectric film 50 is formed on the sidewall of the support pillar forming hole 152 by using, for example, an ALD method, an ALCVD method, or a CVD method. For example, a $SiO_2$ film is preferably used as the dielectric film 50.

Next, in the memory cell region (not illustrated), the memory film forming process (S120) and the channel film forming process (S122) are performed. The details of the memory film forming process (S120) and the channel film forming process (S122) are the same as those of Embodiment 1. By such a process, as illustrated in FIG. 7, the memory film 20 and the channel body 21 are formed in a pillar shape along the inner sidewall surface of the memory film 20. As illustrated in FIG. 7, the memory film 20 includes a block dielectric film 28, a charge accumulation film 26, and a tunnel dielectric film 24.

Figure 32A:
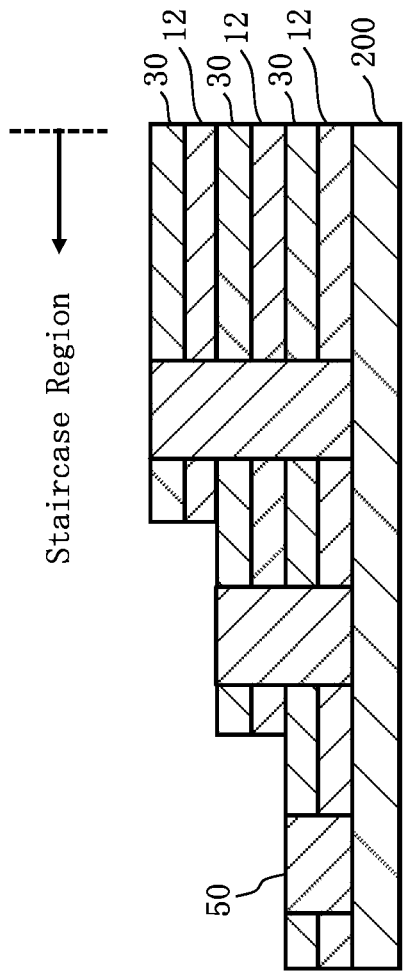
FIGS. 32A to 32C are cross-sectional views illustrating a portion of the processes of the method of manufacturing the semiconductor device according to Embodiment 3.
Figure 32B:
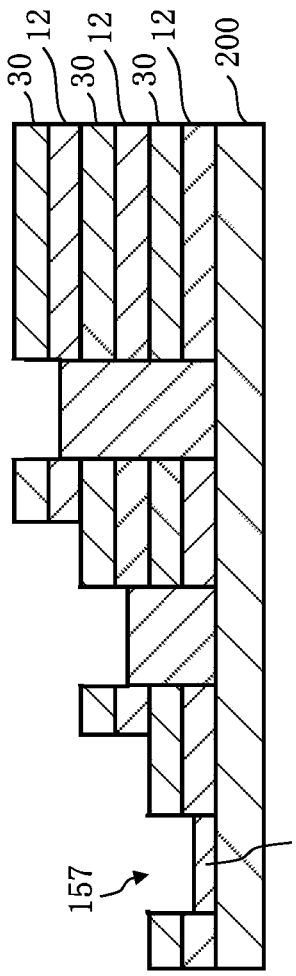
Figure 32C:
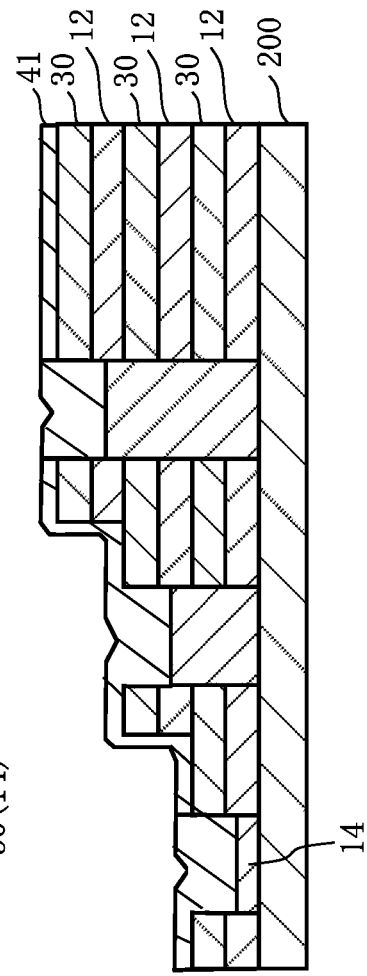

FIGS. 32A to 32C are cross-sectional views illustrating a portion of the processes of the method of manufacturing the semiconductor device according to Embodiment 3. In FIGS. 32A to 32C, the processes from the staircase region forming process (S124) to the sacrificial film forming process (S143) in FIG. 30 are illustrated. The subsequent processes will be described later.

In FIG. 32A, as the staircase region forming process (S124), a staircase shape is formed in the stacked film of the sacrificial film layer 30 and the dielectric layer 12. The details in the staircase region forming process (S124) are the same as those of Embodiment 1. However, in Embodiment 3, in the case of forming each terrace having a staircase shape, out of the sacrificial film layer 30 and the dielectric layer 12, the sacrificial film layer 30 is formed so as to be the exposed surface. In addition, in the example of FIG. 32A, a case where a staircase shape is formed in a terrace in which a set of the sacrificial film layer 30 and the dielectric layer 12 is configured as, for example, one layer is illustrated.

In FIG. 32B, as the etching process (S141), for example, by a maskless etching method, the dielectric film 50 is etched, so that the height position of the surface of the dielectric film 50 is etched down to the height position in the middle of the dielectric layer 12 of the lower layer which is in contact with the exposed sacrificial film layer 30 of the uppermost layer of the stacked film of each terrace having a staircase shape. Therefore, for example, a circular opening (hole 157) is formed on the dielectric film 50. The height position of the surface of the dielectric film 50 is controlled to be located below the bottom surface of the sacrificial film layer 30 of the uppermost layer of the stacked film of each terrace and to be located above the lower surface of the dielectric layer 12 of the lower layer which is in contact with the exposed sacrificial film layer 30 of the uppermost layer of the stacked film of each terrace. For example, the hole 157 may be formed by RIE. At this time, the dielectric film 50 remaining below the hole 157 becomes the support pillar 14.

In FIG. 32C, as the sacrificial film forming process (S143), the sacrificial film 41 is formed on the sacrificial film layer 30 of the uppermost layer of each terrace along the staircase shape in the staircase region by using, for example, an ALD method, an ALCVD method, or a CVD method. The same material as the sacrificial film layer 30 is used as the material of the sacrificial film 41. For example, it is preferable that a SiN film is used as the sacrificial film 41. The film thickness of the sacrificial film 41 on the sacrificial film layer 30 may be set so that the inside of the hole 157 is completely buried by the sacrificial film 41. For example, it is preferable that the film thickness of the sacrificial film is set to at least ½ or more the diameter size of the hole 157.

Figure 33A:
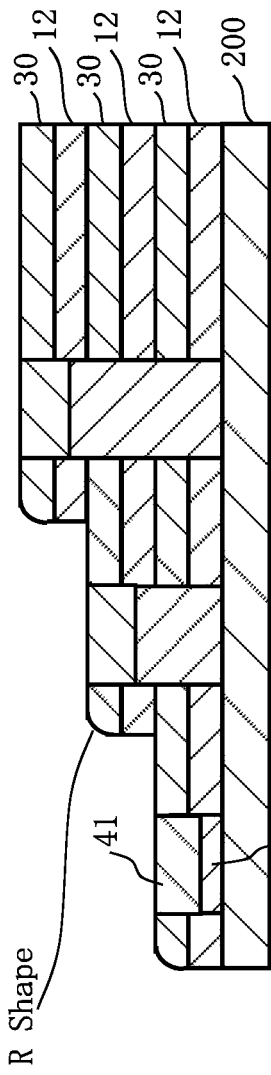
FIGS. 33A to 33C are cross-sectional views illustrating a portion of the processes of the method of manufacturing the semiconductor device according to Embodiment 3.
Figure 33B:
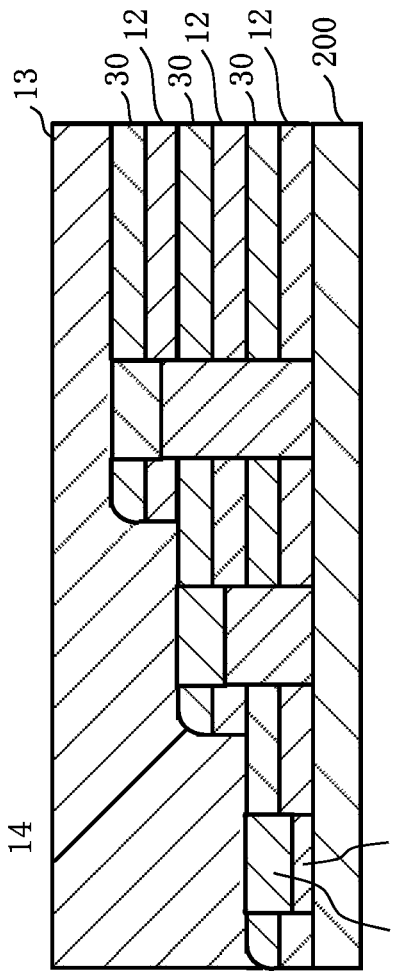
Figure 33C:
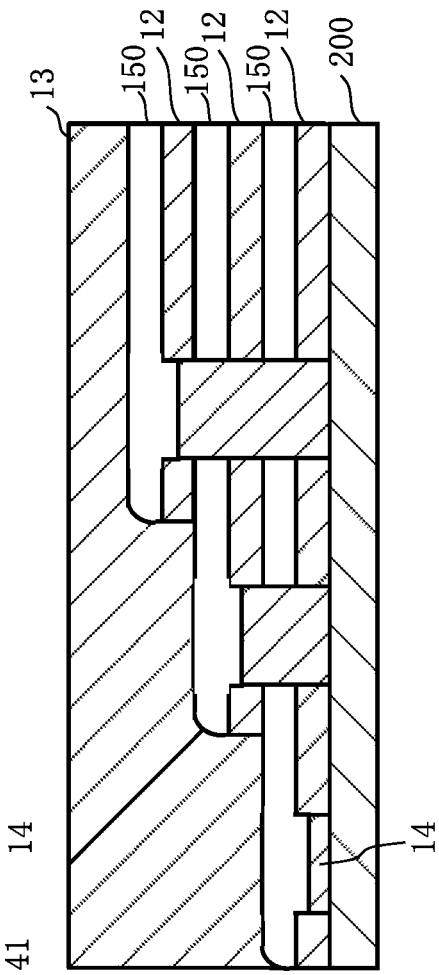

FIGS. 33A to 33C are cross-sectional views illustrating a portion of the processes of the method of manufacturing the semiconductor device in Embodiment 3. In FIGS. 33A to 33C, the processes from the conformal etching process (S145) to a portion of the replacing process (S154) of FIG. 30 are illustrated. The subsequent processes will be described later.

In FIG. 33A, as the conformal etching process (S145), the sacrificial film 41 is conformally etched until the sacrificial film 41 on the end sidewalls of the terraces having a staircase shape is removed. When the sacrificial film 41 on the end sidewall of each terrace can be removed, etch-back may be performed instead of the conformal etching. By conformal etching, the corner of the end portion of each sacrificial film layer 30 protruding so as to have a staircase shape is rounded (in an R shape). Although the upper surface of the sacrificial film 41 is illustrated on the same surface as the upper surface of the sacrificial film layer 30 in FIG. 33A, embodiments are not limited to this configuration. If the side surface of the sacrificial film 41 is connected to the side surface of the sacrificial film layer 30, the upper surface of the sacrificial film 41 may be recessed from the upper surface of the sacrificial film layer 30. In addition, since the same material is used for the sacrificial film 41 and the sacrificial film layer 30, the sacrificial film 41 may remain on the sacrificial film layer 30 after the conformal etching.

In FIG. 33B, as the dielectric film forming/planarizing process (S150), the dielectric film 13 is formed in the staircase region and the memory cell region by using, for example, an ALD method, an ALCVD method, or a CVD method, and after that, planarizing is performed. The details of the dielectric film forming/planarizing process (S150) are the same as those of Embodiment 1.

In FIG. 33C, first, the replacement opening forming process (S152) is performed to form the groove 151 similarly to FIG. 14. The details of the replacement opening forming process (S152) are the same as those of Embodiment 1.

Next, as a portion of the replacing process (S154), the sacrificial film layer 30 and the sacrificial film 41 of each layer are removed by etching through the replacement groove 151 by a wet etching method (for example, hot phosphoric acid treatment). By such a process, a space 150 in which the sacrificial film layer 30 and the region where the sacrificial film 41 is arranged are integrated is formed. In the staircase region, the support pillar 14 extending in a direction perpendicular to the dielectric layer 12 of each layer serves as a support member (pillar), so that the dielectric layer 12 of each layer can be supported so as not to collapse. In the memory cell region, the memory film 20 and the channel body 21 extending in a direction perpendicular to the dielectric layer 12 of each layer serve as support members (pillars), so that the dielectric layer 12 of each layer can be supported so as not to collapse.

Figure 34A:
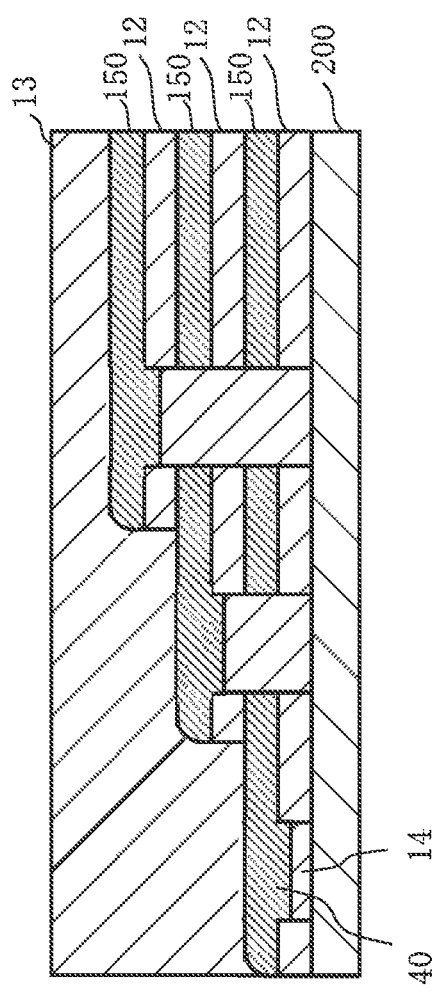
FIGS. 34A and 34B are cross-sectional views illustrating a portion of the processes of the method of manufacturing the semiconductor device according to Embodiment 3.
Figure 34B:
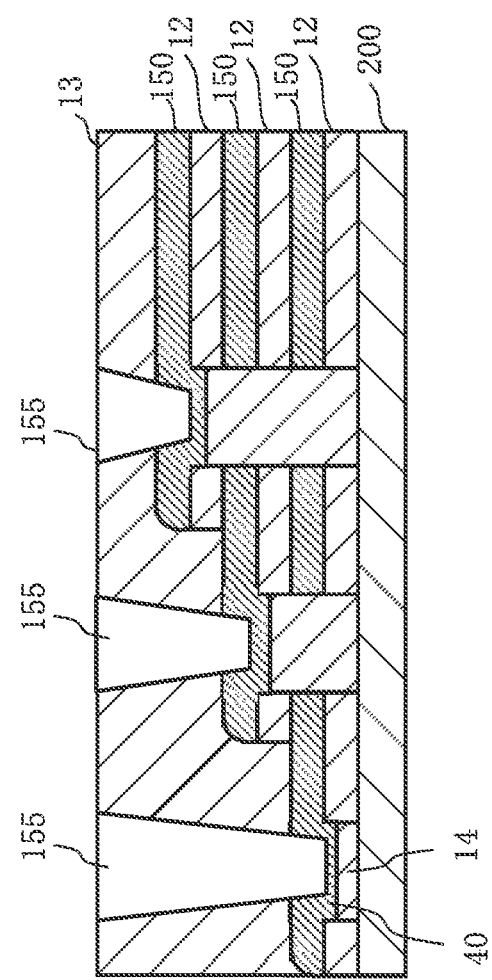

FIGS. 34A and 34B are cross-sectional views illustrating a portion of the processes of the method of manufacturing the semiconductor device in Embodiment 3. In FIGS. 34A and 34B, the processes from the remaining portion of the replacing process (S154) of FIG. 30 to the contact hole forming process (S156) are illustrated. The subsequent processes will be described later.

In FIG. 34A, as the remaining portion of the replacing process (S154), the barrier metal film 11 illustrated in FIG. 7 is first formed on the upper and lower wall surfaces and the sidewall of the space 150 between the dielectric layers 12 of each layer through the replacement groove 151 by using an ALD method, an ALCVD method, or an CVD method. After that, the conductive layer 10 and the metal film 40 are formed by burying a conductive material serving as a word line in the space 150 between the dielectric layers 12 of each layer and in the space 150 integrated with a portion of the region of the dielectric layer 12 including a portion of the sacrificial film 41 by using an ALD method, an ALCVD method, or a CVD method. The details of the replacing process (S154) are the same as those in Embodiment 1, except that the conductive layer 10 and the metal film 40 are integrally formed.

By such a process, as illustrated in FIG. 7, when, for example, $Al_2O_3$ is used as the material of the block dielectric film 28, it is possible to form a memory cell having a MANOS structure with metal (M)-aluminum oxide (A)-nitride film (N)-oxide film (O)-silicon (S).

Alternatively, when a $SiO_2$ film is used as the block dielectric film 28, it is possible to form a memory cell having a MONOS structure with metal (M)-oxide film (O)-nitride film (N)-oxide film (O)-silicon (S).

In FIG. 34B, as the contact hole forming process (S156), the contact hole 155 extending from an upper portion above the dielectric film 13 and reaching each metal film 40 (or the conductive layer 10 integrated with the metal film 40) located on each terrace in the staircase region is formed in the staircase region by using the lithography technique and the RIE method. Each contact hole 155 is opened so as to be located in the region on the inner side in the radial direction of below the corresponding metal film 40. In other words, each contact hole 155 is opened at a position not deviated from the region on the inner side in the radial direction of the support pillar 14 below the corresponding metal film 40. In addition, each contact hole 155 is formed with a size smaller than the diameter size of the support pillar 14 at the height position of the upper surface or the lower surface of the metal film 40.

Then, as the contact forming process (S158), a conductive material is buried in the contact hole 155. For example, W is buried. Therefore, as illustrated in FIG. 29A, each contact 16 having a size smaller than that of the support pillar 14 is connected to the conductive layer 10 (or the conductive layer 10 integrated with the metal film 40) with interposing the metal film 40 at the region position on the inner side in the radial direction of the corresponding support pillar 14.

Besides, in the memory cell area, a bit line contact (not illustrated) and the like are connected to each channel body 21. Thus, the semiconductor device illustrated in FIG. 29A can be formed.

As described above, according to Embodiment 3, since the support pillar 14 made of a dielectric material having a size larger than that of the contact 16 is arranged on the lower layer side at the forming position of each contact 16, even when the contact 16 penetrates through metal film 40, it is possible to prevent contact with the conductive layer 10 of the lower layer side. In addition, since the film thickness of the metal film 40 located in each terrace in the staircase region becomes large, it is difficult for each contact 16 to penetrate through the metal film 40, so that it is possible to increase the process margin. Furthermore, since the diameter size of the metal film 40 is formed to be substantially the same as the diameter size of the support pillar 14, a distance can be allocated between the metal film 40 and the other conductive layer 10, so that it is possible to prevent a short circuit between the conductive layers. In this manner, according to Embodiment 3, it is possible to avoid connection to the conductive layer 10 of the lower layer side in the contact connection of the word line of the three-dimensional NAND flash memory device.

Heretofore, the embodiments have been described with reference to specific examples. However, embodiments are not limited to these specific examples. For example, in the above-described example, a case where the memory film forming process (S120) and the channel film forming process (S122) are performed before the staircase region forming process (S124) is illustrated, and the embodiments are not limited to the case. As the support member (pillar) in the replacing process (S154), the memory film 20 and the channel body 21 are satisfactorily used. Therefore, the memory film forming process (S120) and the channel film forming process (S122) may be performed after the stacked film forming process (S102) and before the replacing process (S154).

In addition, the film thickness of each film, the size, shape, number, and the like of openings can also be appropriately selected and used as required for semiconductor integrated circuits and various semiconductor elements.

Besides, all semiconductor devices which are equipped with the elements of embodiments and of which design can be appropriately changed by those skilled in the art are included in the scope of embodiments.

In addition, for simplifying the description, methods commonly used in the semiconductor industry such as a photolithography process and cleaning before and after processing are omitted, and it is needless to say that these methods are included.

While certain embodiments have been described, these embodiments have been presented by way of example only, and are not intended to limit the scope of the inventions. Indeed, the novel methods and devices described herein may be embodied in a variety of other forms; furthermore, various omissions, substitutions and changes in the form of the methods and devices described herein may be made without departing from the spirit of the inventions. The accompanying claims and their equivalents are intended to cover such forms or modifications as would fall within the scope and spirit of the inventions.

What is claimed is:

1. A semiconductor device comprising:
   a substrate;
   a first conductive layer formed in a plate shape, provided above the substrate and extending in parallel with a surface of the substrate so as to spread over first and second regions;
   a second conductive layer formed in a plate shape, arranged to be separated at a distance above the first conductive layer so as to have a staircase shape with an end portion of the first conductive layer protruding, the second conductive layer extending in parallel with the first conductive layer so as to spread over the first and second regions;
   a first support pillar connected to a lower surface or a side surface of the first conductive layer and extending toward the substrate at a position in the first region and not overlapping with the second conductive layer;
   a second support pillar connected to a lower surface or a side surface of the second conductive layer and extending toward the substrate so as to penetrate through the first conductive layer in the first region;
   a first contact electrically connected to the first conductive layer with a diameter size smaller than a diameter size of the first support pillar at a region position on an inner side in a radial direction of the first support pillar in the first region and extending to the opposite side of the substrate with respect to the first conductive layer;
   a second contact electrically connected to the second conductive layer with a diameter size smaller than a diameter size of the second support pillar at a position of penetrating through the first conductive layer at a region position on an inner side in a radial direction of the second support pillar in the first region and extending to the opposite side of the substrate with respect to the second conductive layer;
   a channel body using a semiconductor material and penetrating through the first and second conductive layers in the second region; and
   a memory film including a charge accumulation film and provided between each of the first and second conductive layers and the channel body in the second region.

2. The device according to claim 1, wherein the end portion of the first conductive layer protruding so as to have the staircase shape includes the region position on the inner side in the radial direction of the first support pillar, and a film thickness of the end portion of the first conductive layer is larger than a film thickness of the first conductive layer in a region portion overlapping with the second conductive layer.

3. The device according to claim 2, wherein an upper surface of the end portion of the first conductive layer is formed closer to the second conductive layer side than an upper surface of the first conductive layer in the region portion overlapping with the second conductive layer.

4. The device according to claim 3,
   wherein the first and second conductive layers are arranged in a stacked body with a plurality of conductive layers and a plurality of dielectric layers being alternately stacked, and
   wherein a groove is formed between a root of the end portion of the first conductive layer protruding so as to have the staircase shape and a dielectric layer above the first conductive layer in the plurality of dielectric layers.

5. The device according to claim 4, wherein the groove is formed below the upper surface of the first conductive layer in the region portion overlapping with the second conductive layer.

6. The device according to claim 1, wherein a film thickness of a portion of the second conductive layer above the second support pillar is larger than a film thickness of the other portion of the second conductive layer.

7. The device according to claim 1, wherein a film thickness of a portion of the first conductive layer above the first support pillar is larger than a film thickness of the other portion of the first conductive layer.

8. The device according to claim 6, wherein an upper surface of the portion of the second conductive layer above the second support pillar is arranged above an upper surface of the other portion of the second conductive layer.

9. The device according to claim 7, wherein an upper surface of the portion of the first conductive layer above the first support pillar is arranged above an upper surface of the other portion of the first conductive layer.

10. The device according to claim 6, wherein a lower surface of the portion of the second conductive layer above the second support pillar is arranged below a lower surface of the other portion of the second conductive layer.

11. The device according to claim 7, wherein a lower surface of the portion of the first conductive layer above the first support pillar is arranged below a lower surface of the other portion of the first conductive layer.

12. A semiconductor device comprising:
    a substrate;
    a first conductive layer formed in a plate shape, provided above the substrate and extending in parallel with a surface of the substrate so as to spread over first and second regions;
    a second conductive layer formed in a plate shape, arranged to be separated at a distance above the first conductive layer so as to have a staircase shape with an end portion of the first conductive layer protruding, the second conductive layer extending in parallel with the first conductive layer so as to spread over the first and second regions;
    a first conductor film arranged so that a portion thereof is included in the first conductive layer at a position in the first region and not overlapping with the second conductive layer, the first conductor film being connected to a side surface of the first conductive layer, the first conductor film having a film thickness larger than that of the first conductive layer;

a second conductor film arranged so that a portion thereof is included in the second conductive layer in the first region, the second conductor film being connected to a side surface of the second conductive layer, the second conductor film having a film thickness larger than that of the second conductive layer;

a first support pillar arranged with substantially a same diameter size as the first conductor film, the first support pillar being connected to a lower surface of the first conductor film and extending toward the substrate;

a second support pillar arranged with substantially a same diameter size as the second conductor film, the second support pillar being connected to a lower surface of the second conductor film and extending toward the substrate so as to penetrate through the first conductive layer;

a first contact connected to the first conductor film with a diameter size smaller than a diameter size of the first support pillar at a region position on an inner side in a radial direction of the first support pillar in the first region;

a second contact connected to the second conductor film with a diameter size smaller than a diameter size of the second support pillar at a region position on an inner side in a radial direction of the second support pillar in the first region;

a channel body using a semiconductor material and penetrating through the first and second conductive layers in the second region; and a memory film including a charge accumulation film and provided between each of the first and second conductive layers and the channel body in the second region.

13. The device according to claim 12, wherein an upper surface of the first conductor film is arranged above an upper surface of the first conductive layer.

14. The device according to claim 12, wherein an upper surface of the second conductor film is arranged above an upper surface of the second conductive layer.

15. The device according to claim 12, wherein a lower surface of the first conductor film is arranged below a lower surface of the first conductive layer.

16. The device according to claim 12, wherein a lower surface of the second conductor film is arranged below a lower surface of the second conductive layer.

17. The device according to claim 12,
wherein the first and second conductive layers are arranged in a stacked body with a plurality of conductive layers and a plurality of dielectric layers being alternately stacked, and
wherein an upper surface of the first conductor film is formed on substantially a same surface as an upper surface of a dielectric layer above the first conductive layer in the plurality of dielectric layers.

18. The device according to claim 12,
wherein the first and second conductive layers are arranged in a stacked body with a plurality of conductive layers and a plurality of dielectric layers being alternately stacked, and
wherein the second support pillar includes a lower film and an upper film made of a dielectric material having an insulation property higher than that of the lower film, and a film thickness of the upper film is larger than a film thickness of at least one dielectric layer provided between the first conductive layer and the second conductive layer in the plurality of dielectric layers.

19. The device according to claim 12, wherein a corner of the end portion of the first conductive layer protruding as to have the staircase shape is rounded.

20. The device according to claim 12, wherein the first conductive layer and the first conductor film are configured with a same material, and the second conductive layer and the second conductor film are configured with a same material.

* * * * *